United States Patent [19]

Okasaka et al.

[11] Patent Number: 5,708,610
[45] Date of Patent: Jan. 13, 1998

[54] SEMICONDUCTOR MEMORY DEVICE AND SEMICONDUCTOR DEVICE

[75] Inventors: Yasuhiko Okasaka; Mikio Asakura; Hideto Hidaka; Masaaki Ura; Fukashi Morishita, all of Hyogo, Japan

[73] Assignee: Mitsubishi Denki Kabushiki Kaisha, Tokyo, Japan

[21] Appl. No.: 602,643

[22] Filed: Feb. 16, 1996

[30] Foreign Application Priority Data

May 29, 1995 [JP] Japan ................... 7-129907
Sep. 20, 1995 [JP] Japan ................... 7-241739

[51] Int. Cl.⁶ ............................................. G11C 5/14
[52] U.S. Cl. ............................ 365/189.06; 365/226
[58] Field of Search .................... 365/189.06, 226, 365/227, 228, 229; 257/665, 357, 360, 361, 362

[56] References Cited

U.S. PATENT DOCUMENTS

| | | | |
|---|---|---|---|
| 4,720,737 | 1/1988 | Shirato | 257/362 |
| 5,072,271 | 12/1991 | Shimizu et al. | 257/362 |
| 5,235,201 | 8/1993 | Honna | 257/357 |
| 5,349,227 | 9/1994 | Murayama | 257/360 |
| 5,581,103 | 12/1996 | Mizukami | 257/360 |

FOREIGN PATENT DOCUMENTS 7-7820  1/1995  Japan .

*Primary Examiner*—Tan T. Nguyen
*Attorney, Agent, or Firm*—Lowe, Price, LeBlanc & Becker

[57] ABSTRACT

For each of pads for control clock signals and address signals included in a DRAM, an n type well region is provided, and each n type well region is connected to an upper power supply means only by means of a first lower power supply line. Therefore, compared with the conventional device in which n type wells are connected to each other by a second lower power supply line, current flowing from the resistance element in a p type well to the upper power supply line is reduced. Therefore, damage to the resistance element 8 can be prevented, and surge immunity of the DRAM is increased.

38 Claims, 34 Drawing Sheets

SEMICONDUCTOR MEMORY DEVICE AND SEMICONDUCTOR DEVICE

BACKGROUND OF THE INVENTION

1. Field of the Invention

The present invention relates to a semiconductor memory device and to a semiconductor device.

More specifically, the present invention relates to a semiconductor memory device and a semiconductor device structured to protect its data portion against a surge current.

2. Description of the Background Art

FIG. 30 is a partially omitted from plan view showing a layout of a conventional dynamic random access memory (hereafter referred to as a DRAM). In the figure, memory mats 51 are provided at four corners of a rectangular chip, respectively. A row recorder 52 is provided along a longer side of each memory mat 51, and a column decoder 53 is provided along a shorter side of each memory mat 51.

A plurality of pads are arranged in one line at a peripheral circuit region 54 at the center of the chip. A ground potential VSS is externally applied to pads 1.1, 1.2 and 1.3. A power supply potential VCC is externally applied to pads 2.1, 2.2 and 2.3. Pads 3.1 to 3.K are used for data signal input/output. Control clock signals /RAS, /CAS, ... are applied to pads 4.1 to 4.M. Address signals A1 to AN are externally applied to pads 5.1 to 5.N.

Along the plurality of pads, three power supply lines 2ALVCC, 2ALVBB and 2ALVSS are provided. To power supply line 2ALVCC, the power supply potential VCC is applied externally through pads 2.1, 2.2 and 2.3. A negative power supply VBB is applied from an internal power supply circuit (not shown) provided in the chip to power supply line 2ALVBB. The ground potential VSS is applied externally to power supply line 2ALVSS through pads 1.1, 1.2 and 1.3.

An internal protecting circuit for protecting an internal circuitry of the DRAM against an externally applied surge current is provided in each pad.

FIG. 31 is a schematic diagram showing the structure of the internal protecting circuit 9 provided in each of pads 4.1 to 4.M and 5.1 to 5.N. Referring to the figure, the internal power protection circuit 9 includes two resistance elements 6 and 8 connected in series between a pad (for example, 5.2) and an internal circuitry of the DRAM, and a field transistor 7 connected between a connection node of the two resistance elements 6 and 8 and a node of the ground potential VSS (hereinafter referred to as the ground node). Field transistor 7 has its gate connected to the ground node.

The surge current input to pad 5.2 is attenuated by resistance element 6. The surge current which has passed through resistance element 6 flows out to the ground node through field transistor 7 by a punch through. The remaining surge current which did not flow out to the ground node is further attenuated by resistance element 8 and flows to an internal circuitry. Therefore, the internal circuitry can be protected against the surge current.

FIG. 32 is a partially omitted view of the portion including pads 4.1 to 4.M and 5.1 to 5.N of FIG. 30, shown in enlargement. Near each of the pads 4.1 to 4.M and 5.1 to 5.N, an n type well region NW for the internal protecting circuit 9 is provided, and two p type well regions PW1 and PW2 are formed in each n type well region NW. Power supply lines 1ALVCC, 1ALVBB and 1ALVSS are provided corresponding to each of the pads 4.1 to 4.M and 5.1 to 5.N.

To each n type well region NW, the power supply potential VCC is applied from power supply line 2ALVCC to power supply line 1ALVCC. To each of the p type well regions PW1 and PW2, the power supply potential VBB is applied from power supply line 2ALVBB through power supply line 1ALVBB. To each p type well region PW1, the ground potential VSS is further applied from power supply line 2ALVSS through power supply line 1ALVSS.

For connecting adjacent well regions NW and PW2, power supply lines 1ALVBB' and 1ALVCC' are provided. The plurality of p type well regions PW2 corresponding to pads 4.1 to 4.M are connected to each other by means of power supply line 1ALVBB'. The plurality of p type well regions PW2 corresponding to pads 5.1 to 5.N are connected to each other by power supply line 1ALVBB'. The plurality of n type well regions NW corresponding to pads 5.1 to 5.N are connected to each other by power supply line 1ALVCC'. The plurality of n type well regions NW corresponding to pads 4.1 to 4.M are not connected to each other by the power supply line 1ALVCC', because of a reason in a layout.

FIG. 33 is enlarged view of a portion including n type well regions NW of FIG. 32. Two p type well regions PW1 and PW2 are formed separated from each other in n type well regions NW. A field transistor 7 of internal protecting circuit 9 is formed in p type well region PW1, and resistance element 8 of internal protecting circuit 9 is formed in p type well region PW2. Field transistor 7 has its gate and source connected to power supply line 1ALVSS. The p type well region PW1 including field transistor 7 is formed separate from p type well region PW2 including resistance element 8 in accordance with a general method of design in which arrangement is performed element by element.

Referring to FIGS. 34 and 35, the structure of internal protecting circuit 9 will described in greater detail. FIG. 34 is an enlarged view of pad 5.2 and portions therearound of FIG. 32, and FIG. 35 is a cross section taken along the line X—X' of FIG. 34.

Referring to FIGS. 34 and 35, in the DRAM chip, a so-called triple well structure is employed. More specifically, at a surface of a p type silicon substrate 20, an n type well region BNW is formed, and at its surface p type well region PW1 and PW2 are formed. Along p type well regions PW1 and PW2, n type well region NW is formed, and p type well regions PW1 and PW2 are separated from p type silicon substrate 20. At the surface of n type well region NW, a band shaped $n^+$ type potential fixed region 21 is formed.

The $n^+$ type drain region 7d of field transistor 7 is formed at the center of the surface of p type well region PW1, and $n^+$ source region 7s is formed surrounding $n^+$ drain region 7d. A band shaped $p^+$ type potential fixed region 22 is formed along the outer periphery of p type well region PW1.

At the central portion of the surface of p type well region PW2, an $n^+$ type diffusion resistance region 8 is formed. The $n^+$ type diffusion resistance region 8 constitutes the resistance element 8 of internal protecting circuit 9. Around the outer periphery of p type well region PW2, a $p^+$ type potential fixed region 23 is formed.

An IF transistor 12 for testing state of connection of pad 5.2 and a bonding wire is also formed in p type well region PW2.

On silicon substrate 20, a polycrystalline silicon layer BL, a lower aluminum interconnection layer 1AL and an upper aluminum interconnection layer 2AL are formed successively. By polycrystalline silicon layer BL, resistance element 6 and interconnections 10 and 11 for cross under are formed. By lower aluminum interconnection layer 1AL, power supply lines 1ALVCC1 to 3, 1ALVCC', 1ALVBB, 1ALVBB', 1ALVSS1, 1ALVSS2 and signal lines 1ALSL1 to 3 are formed. By the upper aluminum interconnection layer 2AL, pad 5.2 and power supply lines 2ALVCC, 2ALVBB and 2ALVSS are formed.

Pad 5.2 is connected to one end of resistance element 6 through signal line 1ALSL1. Resistance element 6 has its the other end connected to one end of resistance element 8 and to $n^+$ type drain region 7d of field transistor 7 through signal line 1ALSL2. Resistance element 8 has the other end connected to the internal circuitry of the DRAM through signal lines 1ALSL3. Power supply line 1ALVSS1 and 1ALVSS2 also serve as gate electrodes 7g1, 7g2 of field transistor 7. Power supply lines 1ALVSS1 and 1ALVSS2 are connected to power supply line 2ALVSS.

Power supply lines 1ALVCC1 to 3 are formed on $n^+$ type potential fixed region 21 of n type well region NW, and connected to $n^+$ type potential fixed region 21 through a contact hole. Power supply lines 1ALVCC1 and 1ALVCC2, and 1ALVCC2 and 1ALVCC3 are connected to each other by interconnections 10 and 11, respectively. Power supply lines 1ALVCC1 and 1ALVCC3 are connected to power supply line 2ALVCC. Power supply line 1ALVCC2 has both ends connected to power supply line 1ALVCC2 corresponding to pads 5.1 and 5.3 through power supply line 1ALVCC', respectively.

Power supply line 1ALVBB is formed along $p^+$ type potential fixed regions 22 and 23 of p type well regions PW1 and PW2, and connected to $p^+$ type potential fixed regions 22 and 23 through contact holes. Power supply line 1ALVBB is connected to power supply line 2ALVBB. Power supply line 1ALVBB is connected to power supply line 1ALVBB corresponding to adjacent pads 5.1, 5.3 through power supply line 1ALVBB' passing above interconnections 10 and 11, respectively.

Structures near remaining pads 5.1, 5.3 to 5.N are similar. The structure near pads 4.1 to 4.M is also similar, except that power supply lines 1ALVCC2 are not connected by power supply line 1ALVCC'.

In FIG. 34, the distance Ly between an end of the resistance element 8 on the input side (connected to $n^+$ type drain region 7d of field transistor 7) and the power supply line 1ALVCC2 is smaller than the distance Lx between the end of resistance element 8 on the input side and the power supply line 1ALVCC3.

FIG. 36 shows a structure of a pad 5.2 and portions therearound of another conventional DRAM not employing the triple well structure. FIG. 37 is a cross section taken along the line Y—Y' of FIG. 36, and FIG. 38 is a cross section taken along the line Z—Z' of FIG. 36.

Referring to the figures, in the DRAM, $n^+$ type drain region 7d and $n^+$ type source region 7s of field transistor 7 and $n^+$ type diffusion resistance region 8 are directly formed at the surface of p type silicon substrate 20, and wells PW and NW are not formed. The $n^+$ type drain region 7d, $n^+$ type source region 7s and $n^+$ type diffusion resistance region 8 are separated from each other by a field oxide film 24. A resistance element 6 is formed by a polycrystalline silicon layer BL, signal lines 1ALSL1 to 3 are formed by lower aluminum interconnection layer 1AL, and pad 5.2 is formed by an upper aluminum interconnection layer 2AL.

Pad 5.2 is connected to one end of signal line 1ALSL1 through a contact hole CH, and the other end of signal line 1ALSL1 is connected to one end of resistance element 6 through contact hole CH. The other end of resistance element 6 is connected to one end of signal line 1ALSL2 through a contact hole CH, and the other end of signal line 1ALSL2 is connected to $n^+$ type drain region 7d of field transistor 7 and to one end of $n^+$ type diffusion resistance region 8 through a contact hole CH. The other end of $n^+$ type diffusion resistance region 8 is connected to single line 1ALSL3 through a contact hole CH, and the other end of signal line 1ALSL3 is connected to the internal circuitry of the DRAM.

The DRAM is similar to the DRAM shown in FIGS. 30 to 35 except that the triple well structure is not employed.

For simplicity, the gate electrodes 7g1 and 7g2 of field transistor 7 and IF transistor 12 shown in FIG. 36 are omitted in FIG. 36.

Further, in FIGS. 30 to 35, field oxide film 24 shown in FIG. 37 and 38 are omitted for simplicity.

FIG. 39 is a cross section showing a still another conventional DRAM structure not employing the triple well structure but employing a trench separation structure, which corresponds to FIG. 37. In the DRAM, $n^+$ type drain region 7d, $n^+$ type source region 7s and $n^+$ plus type diffusion resistance region 8 are separated from each other by a trench separation region 25. Trench separation region 25 is formed by forming at the surface of silicon substrate 20, a trench deeper than a junction portion between $n^+$ type drain region 7d and silicon substrate 20, and by filling the trench with an insulator. The DRAM is similar to that shown in FIGS. 36 to 38 except that it employs the trench separation structure.

In the chip shown in FIGS. 30 to 35 employing a triple well structure, a surge current was applied to each of the pads 4.1 to 4.M and 5.1 to 5.N for testing the surge immunity of the chip. Then it was found that the internal protecting circuit 9 corresponding to pads 5.1 to 5.N was more susceptible to damage than the internal protecting circuit 9 corresponding to pads 4.1 to 4.M. The reason for this may be the fact that the current value flowing from the input side end of resistance element 8 to power supply line 1ALVCC2 differ dependent on the presence/absence of power supply line 1ALVCC'.

Further, it was found that surge immunity of the chip shown in FIGS. 30 to 35 employing the triple well structure has smaller surge immunity than the chip shown in FIGS. 36 to 38 not employing the triple well structure. The reason for this may be the fact that in the chip employing the triple well structure, surge current leaking from resistance element 8 diffuses only in the well regions PW1, NW and BNW, while in the chip not employing the triple well structure, the surge current leaking from resistance element 8 diffuses to the entire signal substrate 20. In other words, it is because of the difference of the capacity of portions absorbing the surge current.

In the chip shown in FIGS. 36 to 38 not employing the triple well structure, it was found that of the junction surfaces between $n^+$ type drain region 7d, $n^+$ type diffusion resistance region 8 and the silicon substrate 20, the portion corresponding to the junction between $n^+$ type drain region 7d, $n^+$ type diffusion resistance region 8 and contact hole CH (for example, the portion Q of FIG. 38) tends to be broken. A reason for this may be the fact that aluminum atoms of contact hole CH diffuse into $n^+$ type drain region 7d and $n^+$ type diffusion resistance region 8, and that there is a large difference in impurity concentration between $n^+$ type region 7d, $n^+$ type diffusion resistance region 8 and silicon substrate 20, so that electric field at the portion Q increases when the surge current flows, resulting in a leak path formed by large current flowing through the portion Q.

The chip shown in FIG. 39 employing not the triple well structure but the trench separation structure has low capability of absorbing surge current. The reason for this may be the fact that the current flowing through the base of npn bipolar transistor formed in the horizontal direction below the field transistor 7 is intercepted by trench separation region 25, and therefore npn bipolar transistor comes to have reduced current drivability.

SUMMARY OF THE INVENTION

Therefore, an object of the present invention is to provide a semiconductor memory device and a semiconductor device having large surge immunity.

In the semiconductor device in accordance with an aspect of the present invention, the first well region provided corresponding to each input terminal is connected to a first upper power supply line through only a corresponding lower power supply line. Therefore, as compared with the prior art example in which the first well region is connected to the first upper power supply line through the lower power supply lines for other input terminals, the current flowing from the diffusion resistance element to the first well region is reduced, and damage to the diffused resistance element is prevented. Thus, surge immunity can be increased.

In the semiconductor memory device in accordance with another aspect of the present invention, the distance between an input side end of the diffusion resistance element which attains to a high potential when the surge current flows in and the potential fixed region of the first well region is set to a prescribed value or larger. Therefore, current flowing from the diffusion resistance element to the potential fixed region of the first well region is reduced, and damage to the diffusion resistance element can be prevented. Thus, the surge immunity is improved.

In the semiconductor memory device in accordance with a further aspect of the present invention, the potential fixed region of the first well region is formed to have a columnar shape. Therefore, as compared with the prior art example in which the potential fixed region of the first well region is formed to have a band shape, the current from flowing from the diffusion resistance element to the potential fixed region of the first region is reduced, and damage to the diffusion resistance element is prevented. Thus, surge immunity is increased.

Further, in the semiconductor memory device according to a still further aspect, the potential fixed region of the first well region is connected to the first power supply line through the resistance element. Therefore, as compared to the prior art in which the potential fixed region of the first well region is directly connected to the first power supply line, the current flowing from the diffusion resistance element to the potential fixed region of the first well region is reduced, and damage to the diffused resistance element is prevent. Thus, surge immunity is increased.

Preferably, the second and the third well regions are formed continuously. Therefore, the capacity of the well region absorbing the surge current leaking from diffused resistance element is increased, and hence surge immunity can further be increased.

In the semiconductor memory device according to a still further aspect, the field effect transistor and the diffused resistance element of the internal protecting circuitry are formed in one second well region. Therefore, as compared with the prior art in which the well region of the field transistor is separated from the well region for the diffused resistance element, the capacitance of the well region absorbing the surge current leaking from the diffusion resistance element is increased. Therefore, surge immunity is increased.

Further, of a plurality of first well regions corresponding to the plurality of input terminals, at least two adjacent first well regions are formed continuously. Therefore, the capacitance of the well regions absorbing the surge current leaking from the diffused resistance element is increased, and surge immunity can further be increased.

In a semiconductor memory device in accordance with a still further aspect, the plurality of input terminals are divided into one or two or more groups, and the lower power supply line and first well region are formed common to the input terminals of each group. The first well region is each connected to the first upper supply line only through the corresponding lower power supply line. Therefore, surge current leaking from the diffusion resistance element is decreased, the capacitance of the well region absorbing the surge current is increased, and the surge immunity is increased.

In the semiconductor memory device in accordance with a still further aspect, the plurality of input terminals are divided into one or more groups, and a first well region is formed common to the input terminals of each group. Therefore, the capacitance of the well region absorbing the surge current leaking from the diffusion resistance element is improved, and surge immunity is improved.

Further, the distance between the input side end of the diffusion resistance element of the internal protecting circuitry and the potential fixed region of the first well region is set to be a prescribed value or more. Therefore, the surge current flowing from the diffusion resistance element to the potential fixed region of the first well region is reduced, and surge immunity can further be increased.

Preferably, the potential fixed region of the first region is formed to have columnar shape. Therefore, surge current flowing from the diffusion resistance element to the potential fixed region of the first well region is reduced, and surge immunity can further be increased.

Further, between the potential fixed region of the first well region and first power supply line, a resistance element is connected. Therefore, the surge current flowing from the diffused resistance element to the potential fixed region of the first well region is reduced and surge immunity can further be increased.

Further, preferably, the second and third well regions are formed continuously. Therefore, the capacitance of the well region absorbing the surge current leaking from the diffused resistance element is increased and surge immunity can further be increased.

In the semiconductor device according to one aspect, of the semiconductor substrate portion for the diffused resistance element of the internal protecting circuitry, at least at a portion corresponding to a contact portion between the diffused resistance element and a metal interconnection, an impurity diffused region having lower impurity concentration than the diffused resistance element is formed. Therefore, the junction portion between the diffused resistance element and semiconductor substrate is made deeper than in the prior art, and difference in impurity concentration at the junction portion is made smaller. Therefore, damage at the junction portion can be prevented and surge immunity can be increased.

In the semiconductor device according to another aspect, a second impurity diffused region to which a fixed potential is applied is formed near the first impurity diffused region of the internal protecting circuitry. Therefore, the surge current leaking from the first impurity diffused region can be absorbed by the second impurity diffused region, and hence surge absorbing capability can be improved.

Further, preferably, of the semiconductor substrate portion below the first impurity diffused region of the internal protecting circuitry, at least a portion corresponding to a contact portion between the first impurity diffused region and a metal interconnection is provided with a third impurity diffused region having lower impurity concentration than the first impurity diffused region. Thus, damage to the junction portion is prevented and surge immunity is increased.

Further, preferably, a fourth impurity diffused region is provided near the first impurity diffused region of the internal protecting circuitry, a second impurity diffused region is formed at the surface of the fourth impurity diffused region, and the impurity concentration of the second impurity diffused region is made higher than that of fourth impurity diffused region. Consequently, the damage at the junction portion between the impurity diffused region and substrate is prevented, and surge immunity is improved.

In the semiconductor device in accordance with a still further aspect, a second impurity diffused region having higher impurity concentration than the first impurity diffused region is provided between the first impurity diffused region of the internal protecting circuitry and the metal interconnection. Therefore, as in the semiconductor device according to the aforementioned one aspect, damage at the junction portion between the impurity diffused region and the semiconductor substrate is prevented, and surge immunity is improved.

Preferably, the first impurity diffused region of the internal protecting circuitry constitutes a diffused resistance element.

In the semiconductor device in accordance with a still further aspect, of the semiconductor substrate portion below the first impurity diffused region of the internal circuitry, in at least a portion corresponding to the contact portion between the first impurity diffused region and the metal interconnection, a second impurity diffused region having lower impurity concentration than the first impurity diffused region is formed. Therefore, the junction portion between the impurity diffused region and the semiconductor substrate is made deeper and difference in impurity concentration at the junction portion becomes smaller. Therefore, damage to the junction portion is prevented and surge immunity is increased.

In the semiconductor device in accordance with a still further aspect, a second impurity diffused region to which a fixed potential is applied is formed near the first impurity diffused region of the internal circuitry. Therefore, the surge current leaking from the first impurity diffused region is absorbed by the second impurity diffused region, and hence surge absorbing capability is increased.

Further, of the semiconductor substrate portion below the first impurity diffused region of the internal circuitry, in at least a portion corresponding to the contact portion between the first impurity diffused region and the metal interconnection, a second impurity diffused region having lower concentration than the first impurity diffused region is formed. Thus, the damage to the junction portion is prevented and surge immunity is increased.

Further, preferably, a fourth impurity diffused region is formed near the first impurity diffused region of the internal circuitry, the second impurity diffused region is formed at the surface of the fourth impurity diffused region, and the impurity concentration of the second impurity diffused region is set higher than that of the fourth impurity diffused region. Therefore, damage to the function portion between impurity diffused region and the substrate is prevented, and surge immunity is improved.

In the semiconductor device in accordance with a still further aspect, of the semiconductor substrate portion below the first impurity diffused region of an output transistor, at least a portion corresponding to a contact portion between the first impurity diffused region and a metal interconnection is provided with a second impurity diffused region having lower impurity concentration than the first impurity diffused region. Therefore, a junction portion between the impurity diffused region and a semiconductor substrate is made deeper and difference in concentration of impurity at the junction portion becomes smaller. Therefore, the damage to the junction portion is prevented and surge immunity is increased.

In the semiconductor device in accordance with a still further aspect, a second impurity diffusion region to which a fixed potential is applied is formed near the first impurity diffused region of the output transistor. Therefore, the surge current leaking from the first impurity diffused region is absorbed by the second impurity diffused region, and surge absorbing capability is increased.

Further, preferably, of the semiconductor substrate portion below the first impurity diffused region of the output transistor, at least a portion corresponding to a contact portion between the first impurity diffused region and a metal interconnection is provided with a third impurity diffused region having lower concentration than the first impurity diffused region. Therefore, damage to the junction portion is prevented and surge immunity can be increased.

However, preferably, a fourth impurity diffused region is provided near the first impurity diffused region of the output transistor, the second impurity diffused region is formed at the surface of the fourth impurity diffused region, and the impurity concentration of the second impurity diffused region is made higher than that of the fourth impurity diffused region. Therefore, damage to the junction portion between the impurity diffused region and substrate is prevented, and surge immunity is increased.

In the semiconductor device in accordance with a still further aspect, of the semiconductor substrate portion below the first impurity diffused region of a transistor for supplying power supply voltage, at least a portion corresponding to the contact portion between the first impurity diffused region and metal interconnection is provided with a second impurity diffused region having lower impurity concentration than the first impurity diffused region. Therefore, the junction portion between the impurity diffused region and semiconductor substrate is made deeper, and difference in impurity concentration at the junction portion is made smaller. Therefore, damage to the junction portion is prevented and surge immunity is increased.

In the semiconductor device in accordance with a still further aspect, a second impurity diffused region to which a fixed potential is applied is formed near the first impurity diffused region of the transistor for supplying power supply potential. Therefore, the surge current leaking from the first impurity diffused region is absorbed by the second impurity diffused region, and hence surge absorbing capability is increased.

Further, preferably, of the semiconductor substrate portion below the first impurity diffused region of the transistor for supplying power supply voltage, at least a portion corresponding to a contact portion between the first impurity diffused region and the metal interconnection is provided with a third impurity diffused region having lower impurity concentration than the first diffused region. Therefore, damage to the junction portion is prevented and surge immunity is increased.

Further, preferably, a fourth impurity diffused region is formed near the first impurity diffused region of the transistor for supplying power supply voltage, and the second impurity diffused region is formed at the fourth impurity diffused region, and the impurity concentration of the second impurity diffused region is set higher than that of the fourth impurity diffused region. Therefore, damage to the junction portion between the impurity diffused region and substrate is prevented, and surge immunity is increased.

Further, in the semiconductor device in accordance with a still further aspect, the internal protecting circuitry includes a first impurity diffused region formed in the surface of the semiconductor substrate and having a conductivity type different from that of the semiconductor substrate; a second impurity diffused region having the same conductivity type as the semiconductor substrate formed at the surface of the first impurity diffused region and connected to an input terminal and the internal circuitry; a third impurity diffused region formed near the first impurity diffused region and having a conductivity type different from the semiconductor substrate; and a fourth impurity diffused region formed at the surface of the third impurity diffused region and to which a fixed potential is applied, having the same conductivity type as a semiconductor substrate. Therefore, in addition to a bipolar transistor in the horizontal direction, a bipolar transistor in vertical direction is formed. Therefore, as compared with the prior art in which only a horizontal bipolar transistor is formed, surge absorbing capability is improved.

Further, preferably, a bias potential for preventing flow of current from the input terminal to the first impurity diffused region in normal operation is applied to the first impurity diffused region.

Further, the semiconductor device is formed to have the trench separation structure, on the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
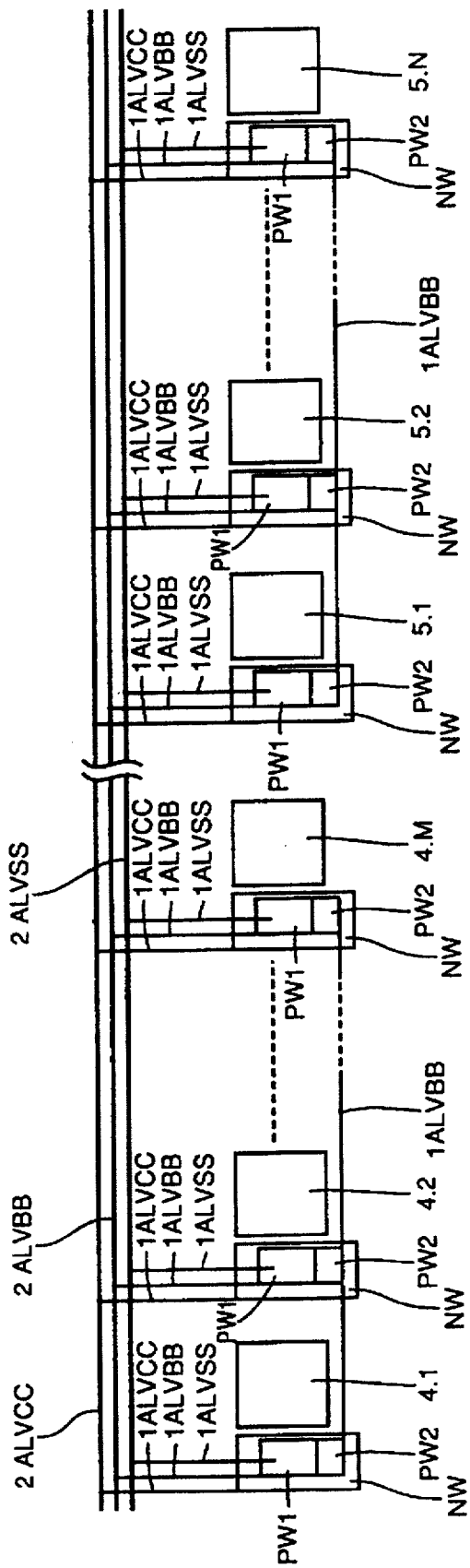
FIG. 1 shows a portion including pads 4.1 to 4.M and 5.1 to 5.M of the DRAM in accordance with a first embodiment, partially omitted.
Figure 2:
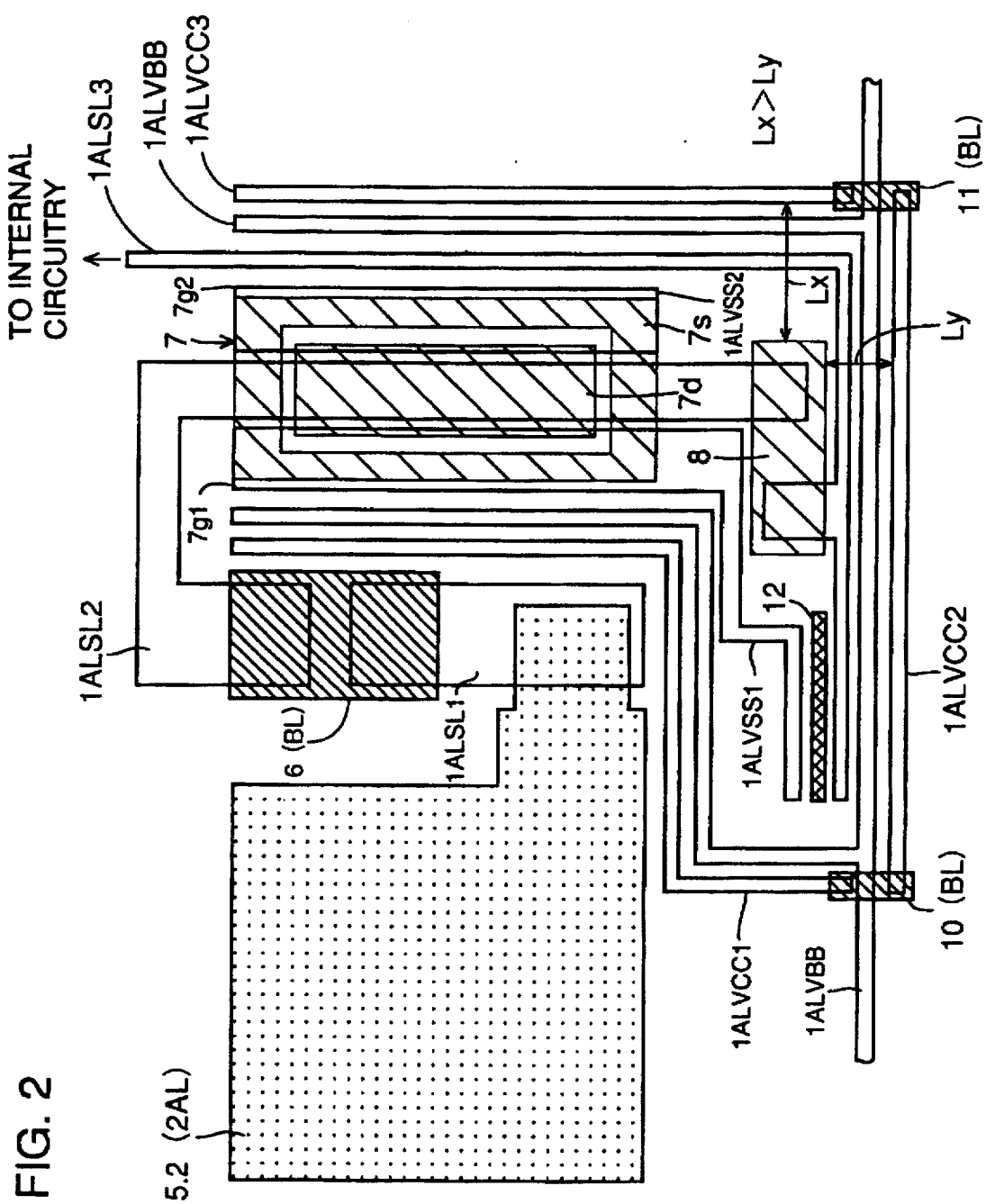
FIG. 2 is an enlarged view showing the pad 5.2 and portions therearound of the DRAM shown in FIG. 1.
Figure 32:
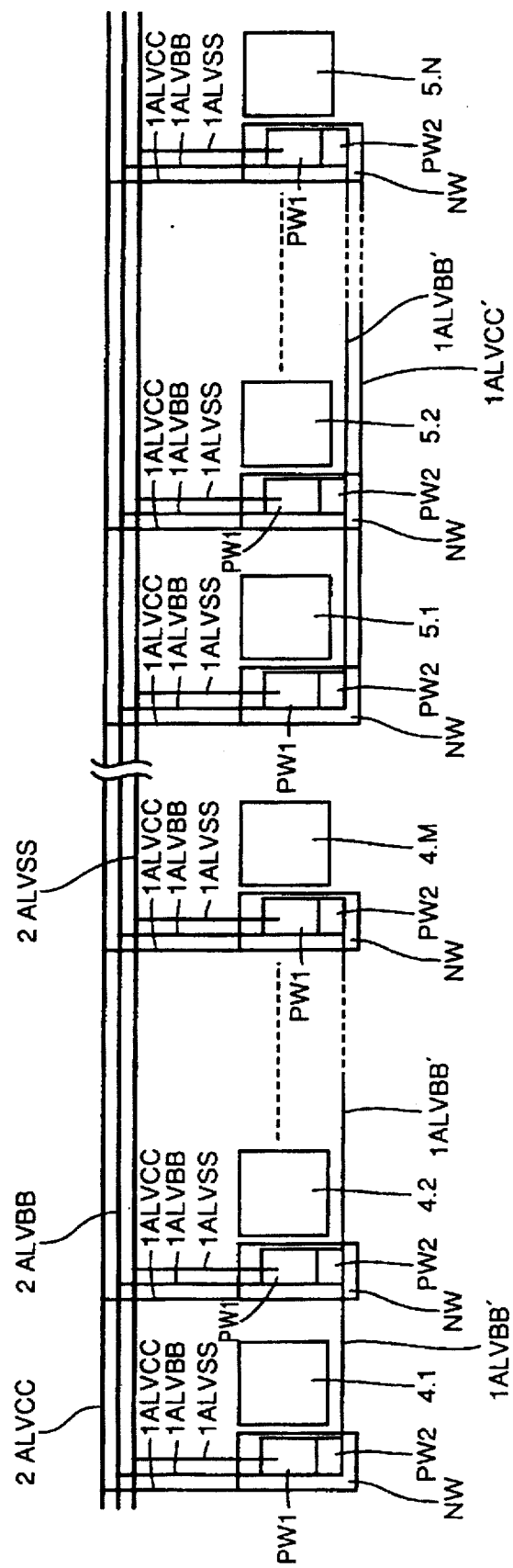
FIG. 32 is a partially omitted schematic diagram showing, in enlargement, structure of a portion including pads 4.1 to 4.M and 5.1 to 5.N of the DRAM shown in FIG. 30.

FIG. 1 is an enlarged view of a portion including pads 4.1 to 4.M and 5.1 to 5.N of the DRAM in accordance with the first embodiment of the present invention, which corresponds to FIG. 32. FIG. 2 is an enlarged view of the pad 5.2 and portions therearound of FIG. 1, which corresponds to FIG. 34.

Referring to FIGS. 1 and 2, the DRAM differs from the conventional DRAM in that n type well regions NW of internal protecting circuitry 9 for corresponding pads 5.1 to 5.N, that is, power supply lines 1ALVCC are not connected to each other by power supply line 1ALVCC'. Therefore, the interconnection of internal protecting circuitry for pads 4.1 to 4.N is completely identical with the interconnection of the internal power protecting circuitry for the pads 5.1 to 5.N.

In this embodiment, power supply lines 1ALVCC2 are connected to each other by the power supply line 1ALVCC', and therefore, even when current flows from resistance element 8 of FIG. 2 to power supply line 1ALVCC2, the current does not flow through power supply line 1ALVCC' to the power supply line 1ALVCC2 corresponding to other pads 5.1, 5.3 to 5.N, nor to the power supply line 2ALVCC. Further, the current flowing from resistance element 8 to power supply line 1ALVCC2 is limited by the interconnections 10 and 11 formed by the polycrystalline silicon layer BL. Therefore, the flow of a large current from the resistance element 8 to the power supply line 1ALVCC2 can be prevented, and the damage to the resistance element 8 is prevented. Therefore, surge immunity of the DRAM can be increased.

Second Embodiment

Figure 3:
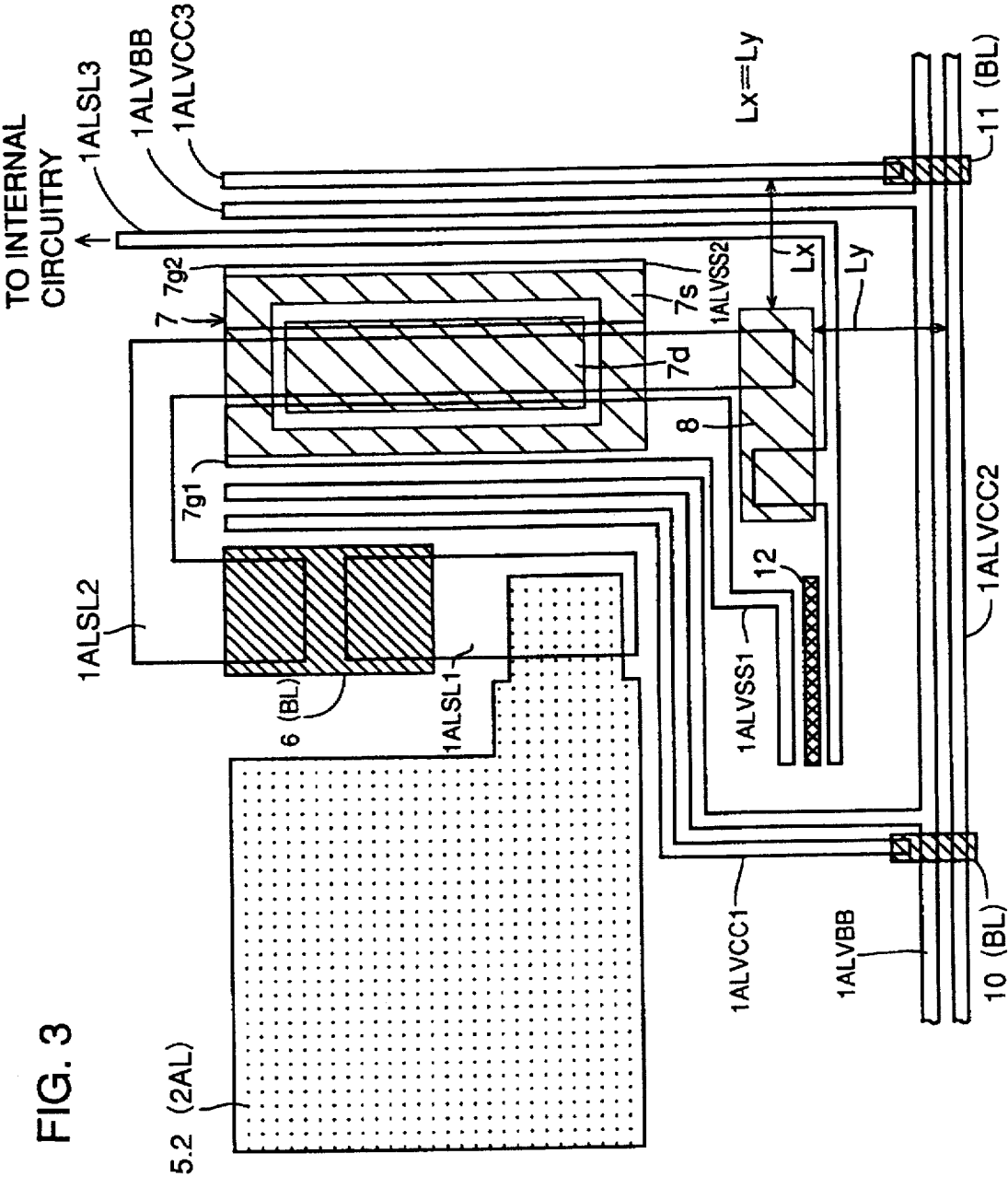
FIG. 3 is an enlarged view showing the pad 5.2 and portions therearound of the DRAM in accordance with a second embodiment of the present invention.
Figure 34:
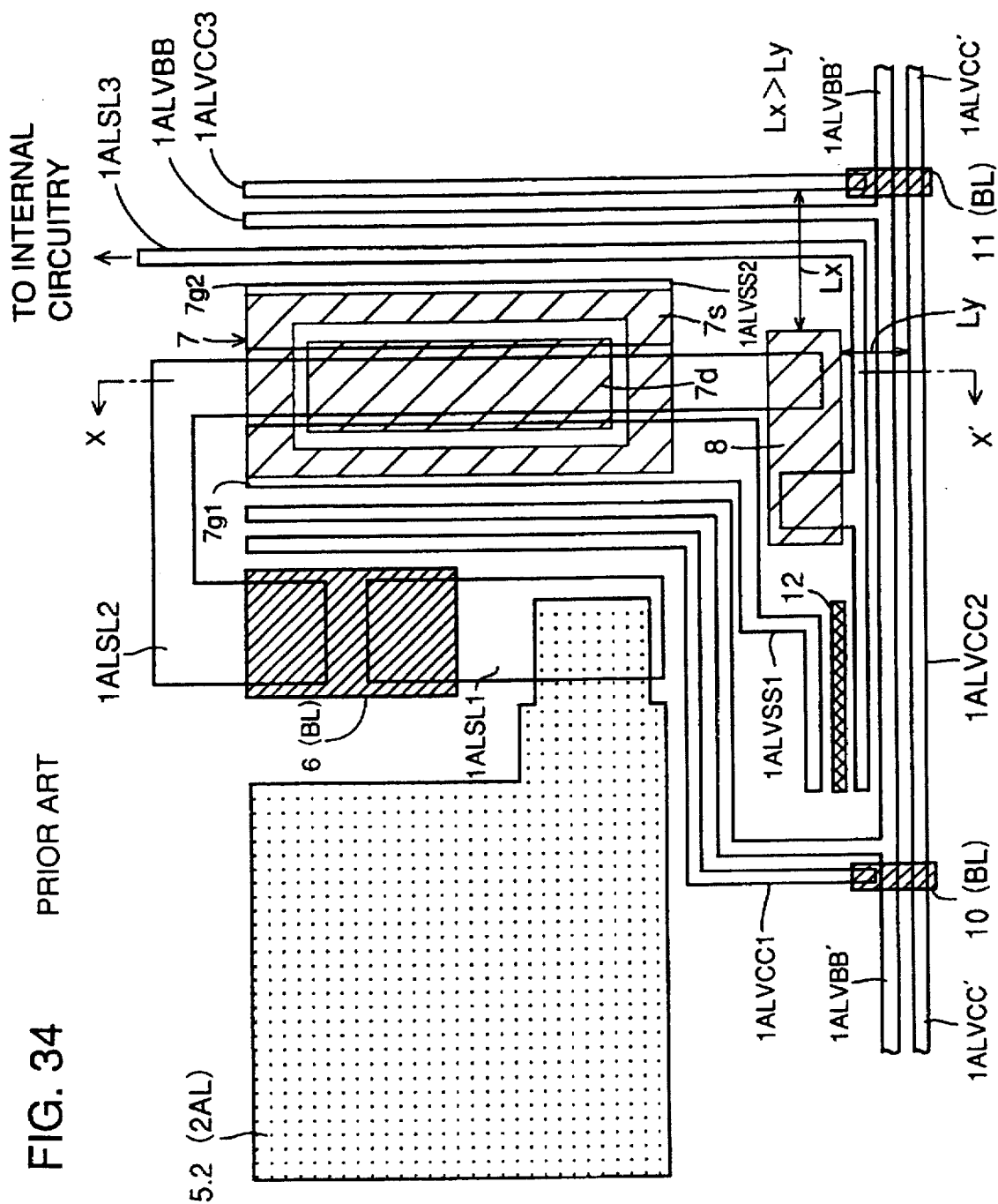
FIG. 34 shows, in enlargement, the structure of the pad 5.2 and portions therearound of the DRAM shown in FIG. 32.

FIG. 3 shows, in enlargement, the pad 5.2 and portions therearound of the DRAM in accordance with a second embodiment of the present invention, which corresponds to FIG. 34.

Referring to FIG. 3, the DRAM differs from the conventional DRAM in that distance Ly between the input end of resistance element 8 which attains a high potential when the surge current flows in and the power supply line 1ALVCC2 is set approximately as large as the distance Lx between the input end of resistance element 8 and power supply line 1ALVCC.

In this embodiment, since the distance Ly is set approximately as large as a distance Lx as mentioned above, the current flowing from the resistance element 8 to power supply line 1ALVCC2 is reduced.

Therefore, damage to the resistance element 8 is prevented and surge immunity of the DRAM is increased.

Third Embodiment

Figure 4:
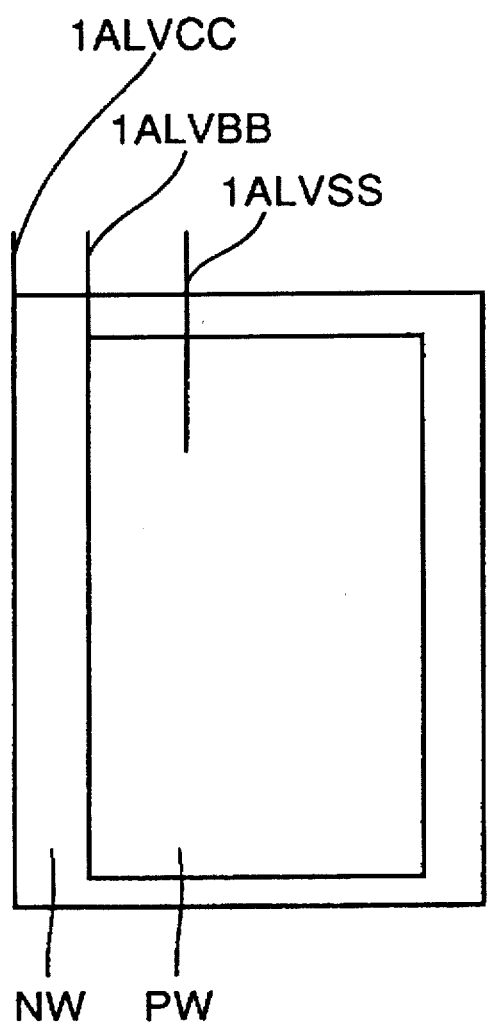
FIG. 4 shows structures of well regions NW and PW provided corresponding to each pad of the DRAM in accordance with a third embodiment of the present invention.
Figure 5:
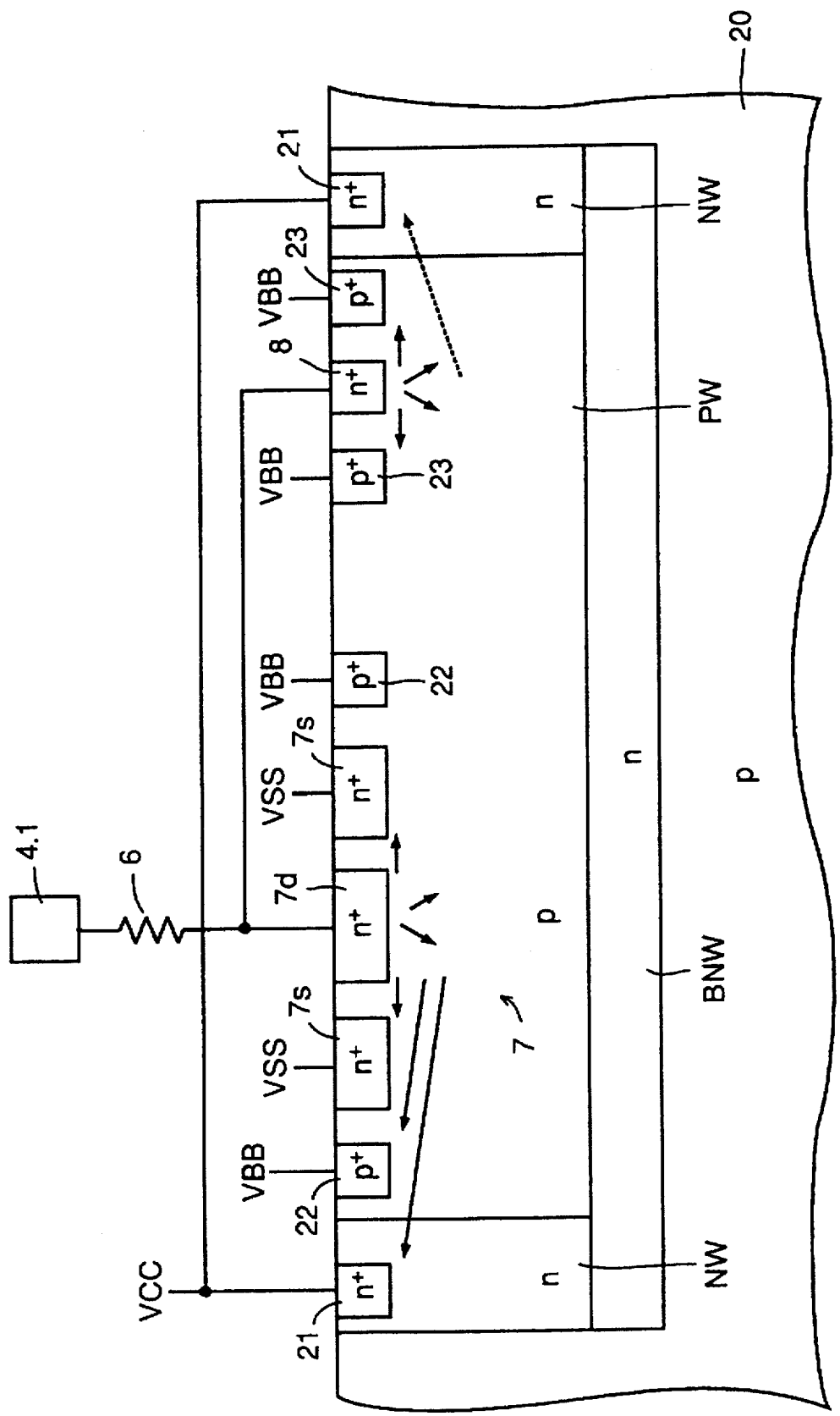
FIG. 5 is a cross section of the well regions NW and PW of the DRAM shown in FIG. 4.
Figure 33:
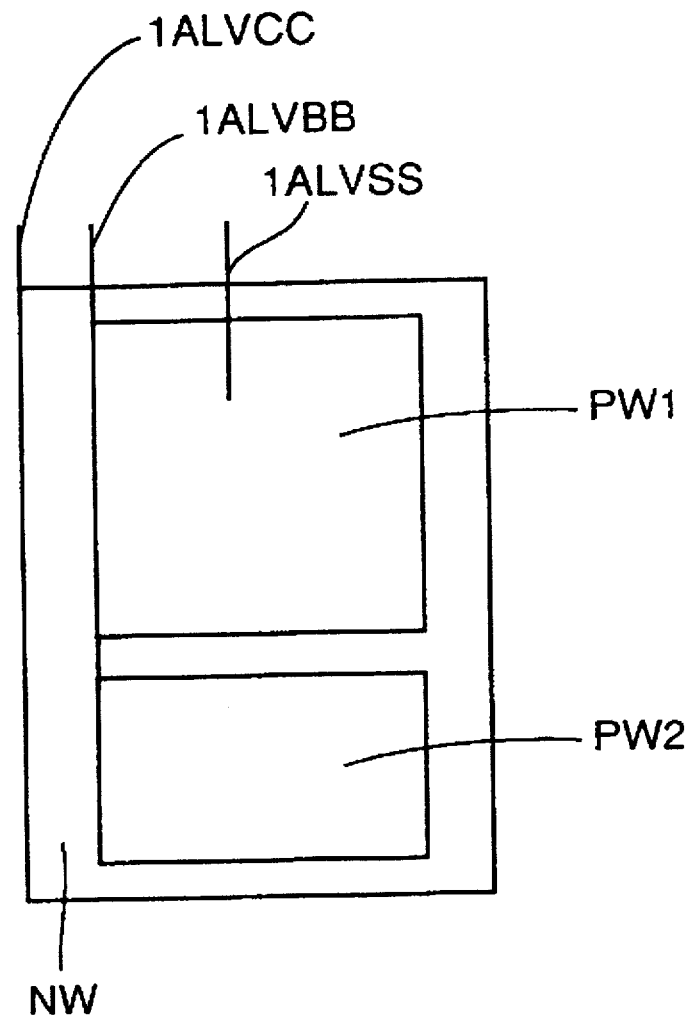
FIG. 33 shows, in enlargement, the structure of a well region provided corresponding to each pad of the DRAM shown in FIG. 31.
Figure 35:
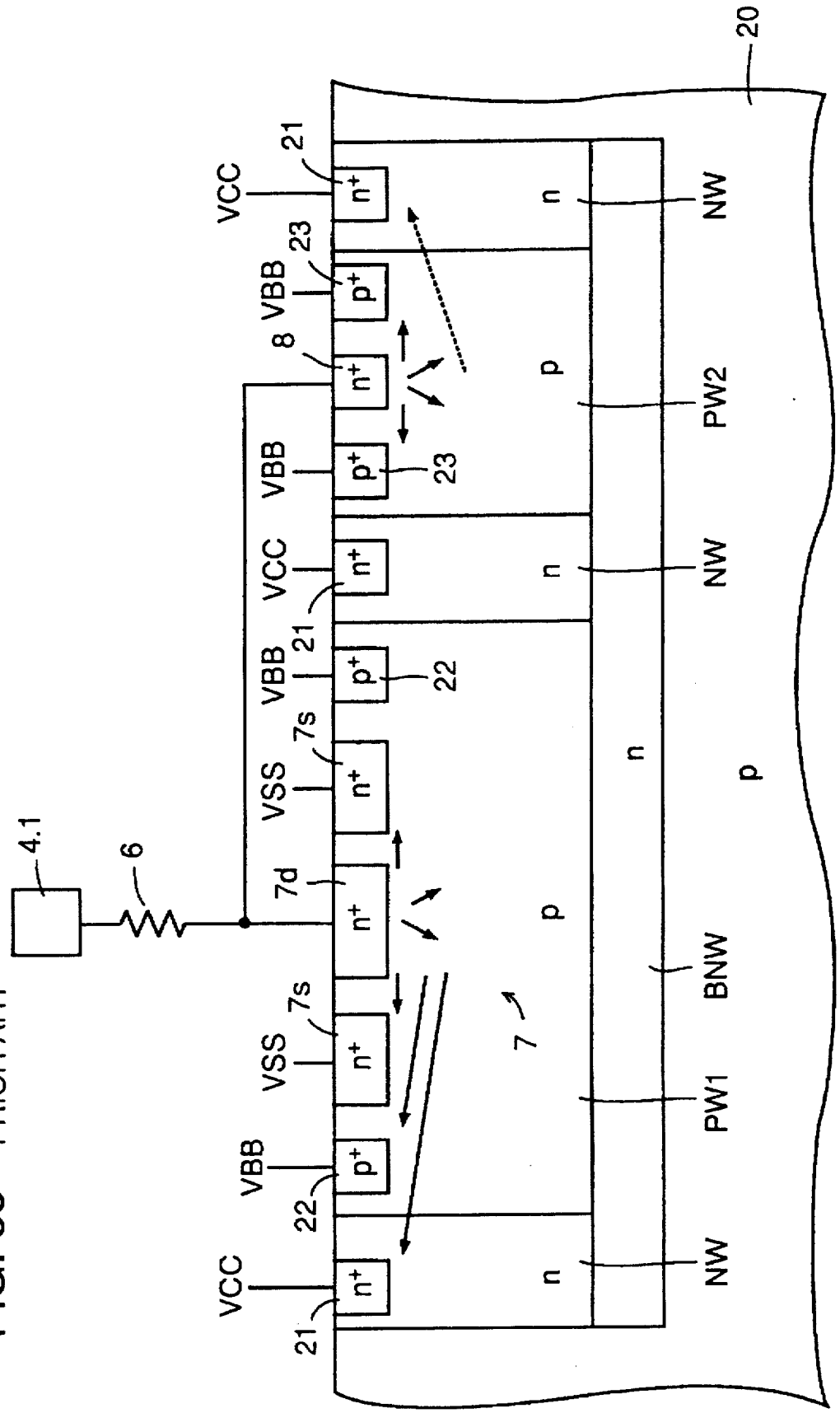
FIG. 35 is a cross section taken along the line X—X' of FIG. 34.
Figure 36:
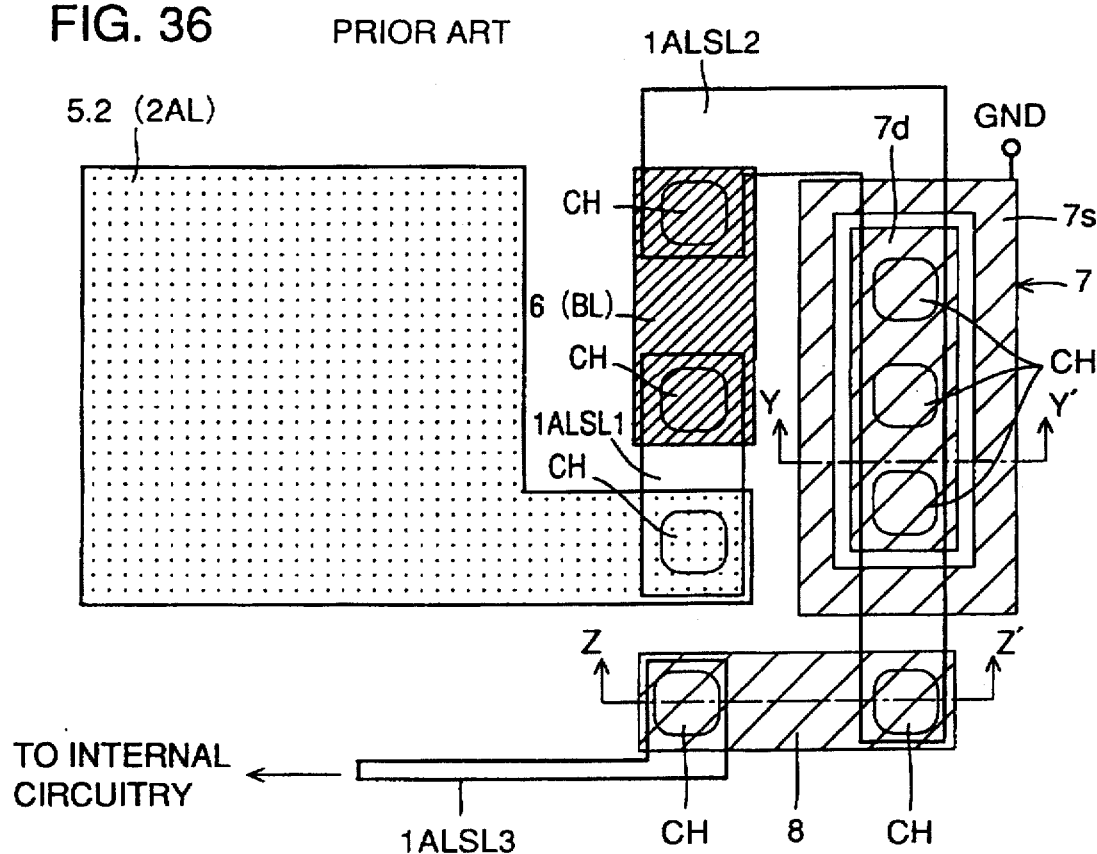
FIG. 36 shows the structure of pad 5.2 and portions therearound of another conventional DRAM.
Figure 37:
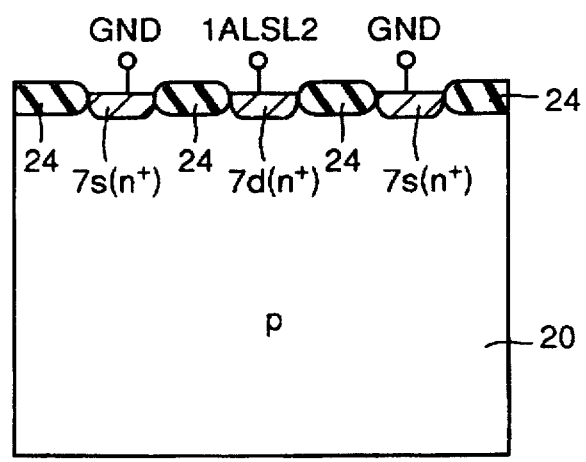
FIG. 37 is a cross section taken along the line Y—Y' of FIG. 36.

FIG. 4 shows a structure of a well region provided corresponding to each of the pads 4.1 to 4.M and 5.1 to 5.N in accordance with a third embodiment of the present invention, which corresponds to FIG. 33. FIG. 5 is a cross section of the well region shown in FIG. 4 and it corresponds to FIG. 35.

Referring to FIGS. 4 and 5, the DRAM differs from the conventional DRAM in which p type well regions PW1 and PW2 are formed continuously, and one p type well region PW is formed in the n type well region NW. The field transistor 7 and resistance element 8 of internal protecting circuitry 9 are both formed in p type well region PW.

In this embodiment, since two p type well regions PW1 and PW2 are formed continuously, the capacity of the well region absorbing the surge current leaking from resistance element 8 is increased as compared with the prior art in which two p type well regions PW1 and PW2 are provided separately. Therefore, surge immunity of the DRAM is increased.

Fourth Embodiment

Figure 6:
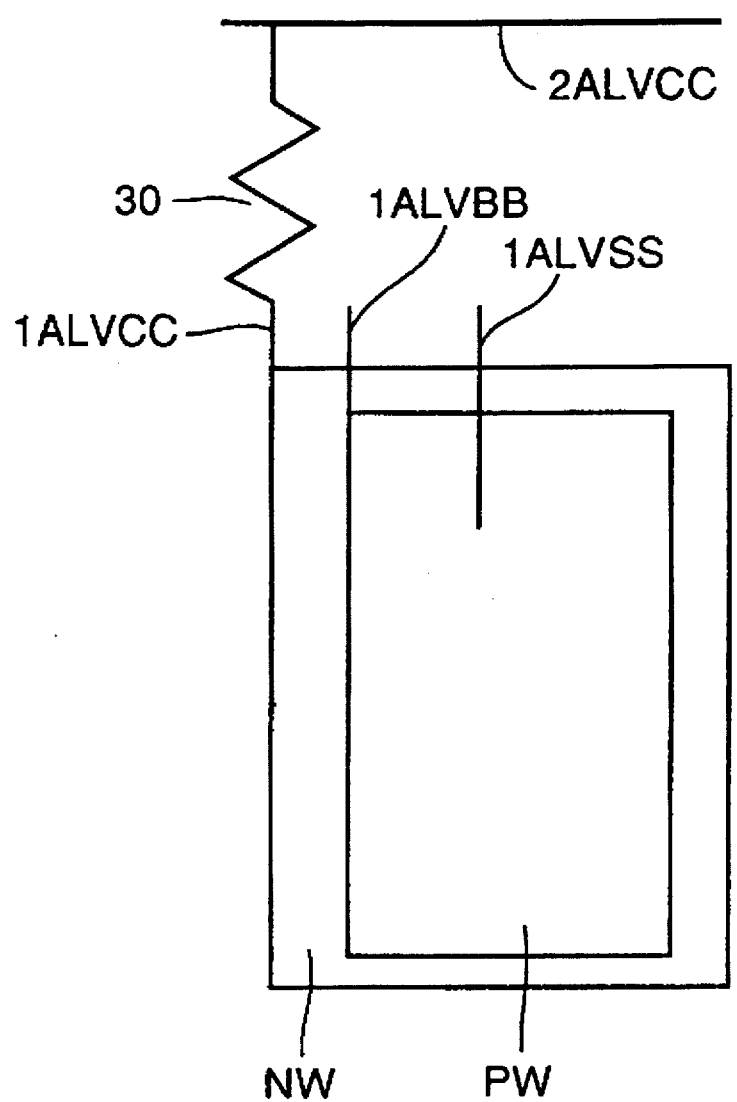
FIG. 6 shows a structure of the portion including well regions NW and PW provided corresponding to each pad of the DRAM in accordance with the fourth embodiment of the present invention.

FIG. 6 shows a portion including regions NW and PW provided corresponding to each of the pads 4.1 to 4.M and 5.1 to 5.N in accordance with the fourth embodiment of the present invention.

Referring to FIG. 6, the DRAM differs from the DRAM shown in FIG. 4 in that a resistance element 30 is connected between power supply lines 1ALVCC and 2ALVCC.

In this embodiment, current flowing from resistance element 8 in p type well region PW to power supply line 2ALVCC through supply line 1ALVCC is reduced by resistance element 30. Therefore, damage to the resistance element 8 of internal protecting circuitry 9 is prevented, and surge immunity of the DRAM is increased.

Fifth Embodiment

Figure 7:
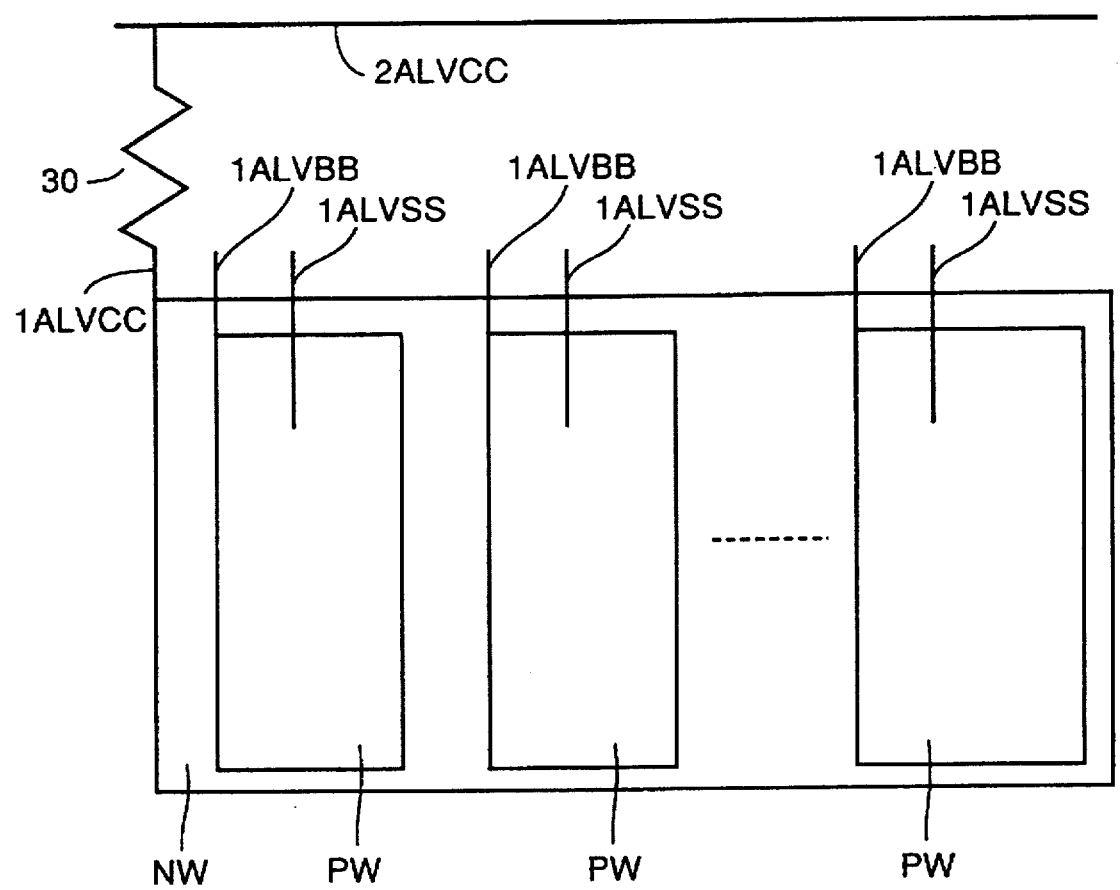
FIG. 7 is a partially omitted diagram showing the structure of the DRAM in accordance with a fifth embodiment of the present invention.

FIG. 7 is a partially omitted diagram showing a structure of a DRAM in accordance with the fifth embodiment of the present invention.

Referring to FIG. 7, the DRAM differs from that of FIG. 6 in that all the n type well regions NW are formed continuously and all the p type well regions PW are formed in one n type well region NW. The power supply line 1ALVCC for the n type well region NW is connected to power supply line 2ALVCC through one resistance element 30.

In this embodiment, since all the n type well regions NW are formed continuously, the capacitance of the well region absorbing the surge current leaking from the resistance element 8 formed in p type well region PW can be increased as compared with the prior art example in which n type regions are separated from each other. Therefore, surge immunity of the DRAM is increased.

Further, since one resistance element 30 is provided for all the p type well regions PW1, the layout area can be reduced as compared with the DRAM shown in FIG. 6 in which resistance element 30 is provided for each p type well region PW.

In this embodiment, all the p type well regions PW are formed in one n type well region NW. However, it is not limited thereto. For example, a plurality of p type well regions PW may be divided to groups each including prescribed number of well regions, and p type well regions PW of each group may be formed in one n type well region NW. For example, the p type well regions PW for pads 4.1 to 4.M may be formed in one n type well region NW and p type well regions PW for pads 5.1 to 5.N may be formed in another N type well region NW.

Sixth Embodiment

Figure 8:
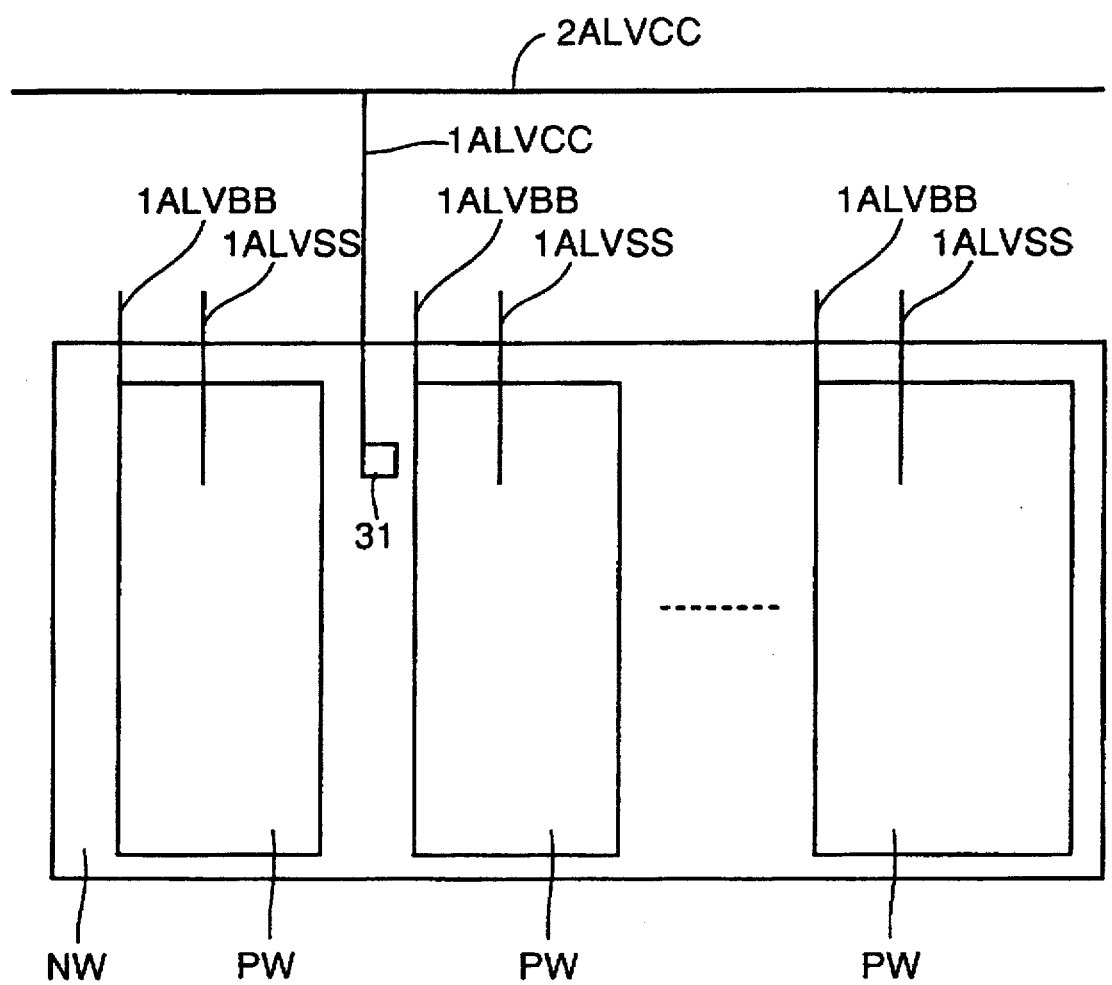
FIG. 8 is a partially omitted diagram showing a structure of the DRAM in accordance with a sixth embodiment of the present invention.

FIG. 8 is a partially omitted schematic diagram showing a structure of the DRAM in accordance with the sixth embodiment of the present invention.

Referring to FIG. 8, the DRAM differs from the DRAM shown in FIG. 7 in that an $n^+$ type potential fixed region 14 having a columnar shape is formed from the surface of n type well region NW to the inside, and that the $n^+$ type potential fixed region 31 is connected to the power supply line 2ALVCC through power supply line 1ALVCC.

In this embodiment, since $n^+$ type potential fixed region 31 is formed to have a columnar shape, the current flowing from the resistance element 8 of p type well region PW to power supply line 2ALVCC through $n^+$ type potential fixed region 31 and power supply line 1ALVCC can be made smaller as compared with the prior art in which $n^+$ type potential fixed region 21 is formed to have a band shape. Therefore, damage to the resistance element 8 is prevented and surge immunity of the DRAM can be increased.

Seventh Embodiment

Figure 9:
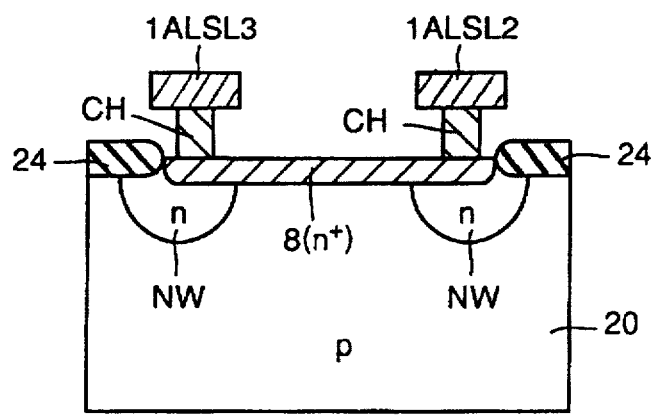
FIG. 9 is a cross section showing the structure of the DRAM in accordance with a seventh embodiment of the present invention.
Figure 38:
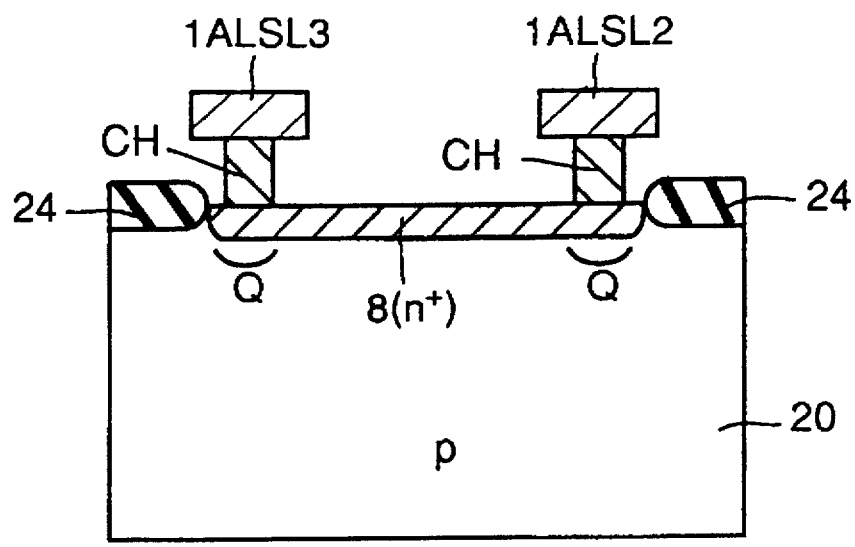
FIG. 38 is a cross section taken along the line Z—Z' of FIG. 36.

FIG. 9 is a cross section showing the structure of the DRAM in accordance with the seventh embodiment, which corresponds to FIG. 38.

Referring to FIG. 9, the DRAM differs from the DRAM shown in FIG. 38 in that, of the silicon substrate 20 below the $n^+$ type diffusion resistance region 8, a portion corresponding to the contact portion between contact hole CH and $n^+$ type diffusion resistance region 8 is provided with an n type well region NW having lower impurity concentration than $n^+$ type diffusion resistance region 8.

In this embodiment, since the n type well region NW is provided below the contact portion between contact hole CH and $n^+$ type diffusion resistance region 8, even if aluminum atoms in contact hole CH diffuse in the $n^+$ type diffusion resistance region 8, the influence of the aluminum atoms on the junction portion between n type well region NW and silicon substrate 20 is small. The gradient of impurity concentration below the contact portion between contact hole CH and $n^+$ type diffusion resistance region 8 becomes smaller than the prior art. Therefore, the electric field below the contact hole CH is smaller than in the prior art when the surge current flows, and smaller current flows from contact hole CH to silicon substrate 20. Therefore, damage to the junction portion between $n^+$ type diffusion resistance region 8 and silicon substrate 20 below the contact hole CH caused by surge current can be prevented, and surge immunity is improved.

Figure 10:
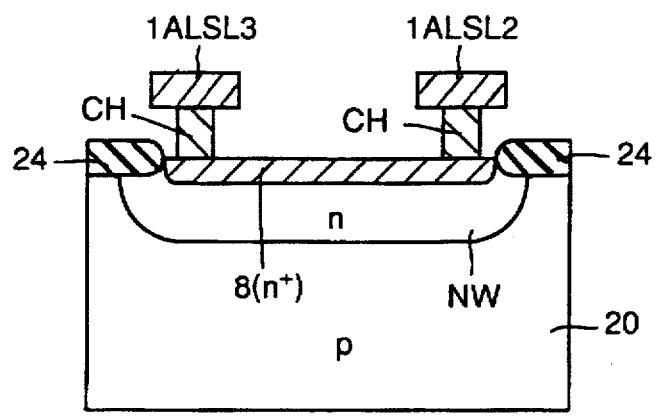
FIG. 10 is a cross section showing a modification of the DRAM shown in FIG. 9.

In this embodiment, the n type well region NW is provided only at the portion corresponding to the contact portion between contact hole CH and $n^+$ type diffusion resistance region 8 of the silicon substrate 20 below $n^+$ type diffusion resistance region 8. However, n type well region NW may be provided entirely in the portion of the silicon substrate 20 below the $n^+$ type diffusion resistance region 8, as shown in FIG. 10. However, in that case, each of the $n^+$ type diffusion resistance region 8 and n type well region NW perform diffusion resistance element respectively, and therefore the diffusion resistance element constituted by $n^+$ diffusion resistance region 8 and diffusion resistance element constituted by n type well region NW are connected parallel between signal lines 1ALSL2 and 1ALSL3.

Eighth Embodiment

Figure 11:
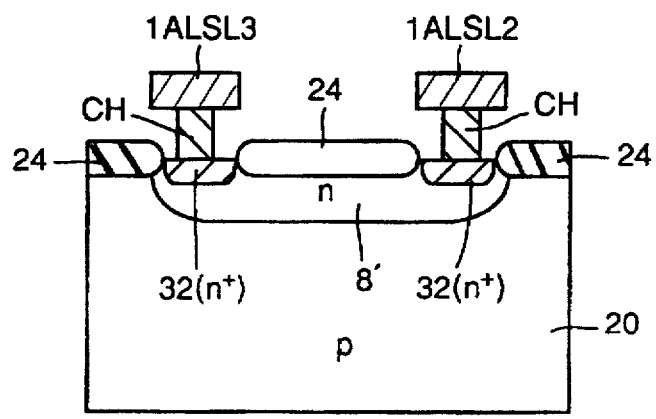
FIG. 11 is a cross section showing a structure of the DRAM in accordance with an eighth embodiment of the present invention.

FIG. 11 is a cross section showing the structure of the DRAM in accordance with the eighth embodiment, which corresponds to FIG. 38.

Referring to FIG. 11, in this DRAM, an n type diffusion resistance region 8' which is deeper than and having lower impurity concentration than $n^+$ type diffusion resistance region 8 of FIG. 38 is formed at the surface of silicon substrate 20, and an $n^+$ type diffusion region 32 having higher impurity concentration than the n type diffusion resistance region 8' is formed at the surfaces at both end portions of n type diffusion resistance region 8'. The $n^+$ type diffusion region 32 on one end of n type diffusion resistance region 8' is connected to signal line 1ALSL2 through contact hole CH, while the $n^+$ type diffusion region 32 on the other end of n type diffusion resistance region 8' is connected to signal line 1ALSL3 through contact hole CH.

In this embodiment, the diffusion resistance element is provided by the n type diffusion resistance region 8' having high resistance, the junction portion between diffused resistance region 8' and silicon substrate 20 is made deeper than the prior art, and $n^+$ type diffusion regions 32 are formed between n type diffusion resistance region 8' and contact hole CH. Therefore, electric field below the contact hole CH is made smaller than in the prior art when the surge current flows, and smaller current flows from contact hole CH to silicon substrate 20. Therefore, damage to the junction portion between n type diffusion resistance region 8' and silicon substrate 20 below the contact hole CH caused by the surge current can be prevented, and surge immunity can be increased.

Ninth Embodiment

Figure 12A:
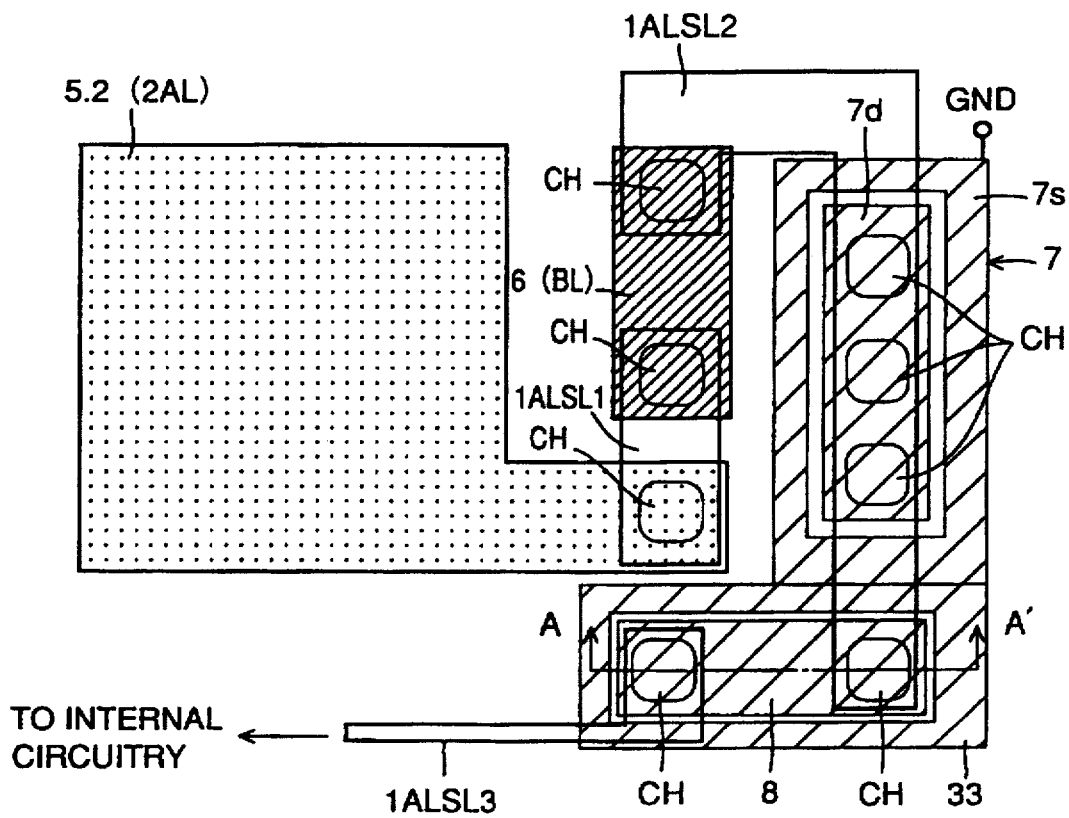
FIGS. 12A and 12B show the structure of the pad 5.2 and portions therearound of the DRAM in accordance with a ninth embodiment of the present invention.
Figure 14A:
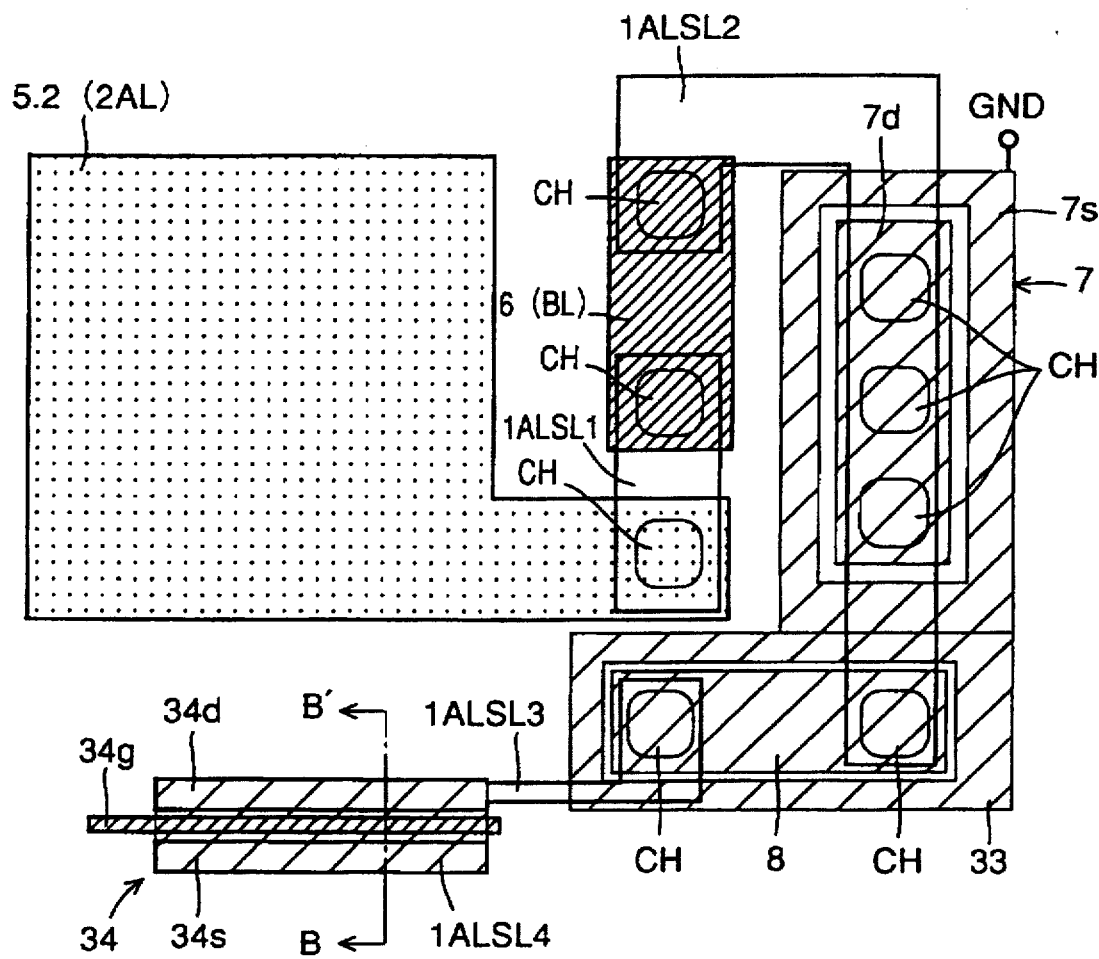
FIGS. 14A and 14B show structures of pad 5.2 and portions therearound of the DRAM in accordance with a tenth embodiment of the present invention.
Figure 14B:
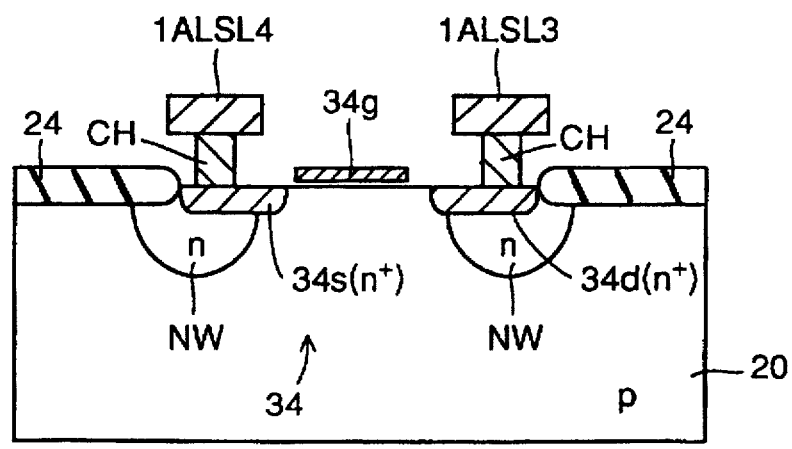

FIG. 14A shows the pad 5.2 and portions therearound of the DRAM in accordance with the ninth embodiment, and FIG. 14B is a cross section taken along, the line A—A' of FIG. 12A.

Figure 12B:
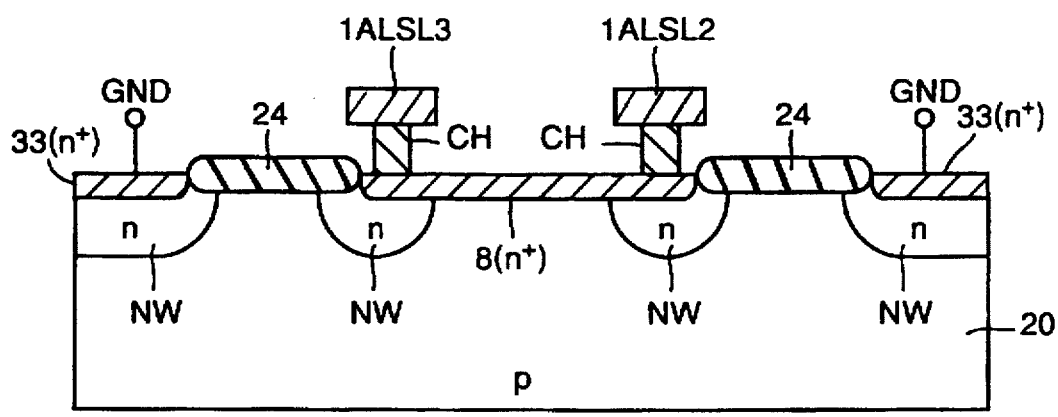

Referring to FIGS. 12A and 12B, the DRAM differs from the DRAM of FIG. 9 in that an n type well region NW is formed along $n^+$ type diffusion resistance region 8 near the $n^+$ diffusion resistance region 8 at the surface of silicon substrate 20, and an $n^+$ type diffusion region 33 is formed at the surface of n type well region NW. To the $n^+$ type diffusion region 33, as well as to the $n^+$ source region 7s of field transistor 7, the ground potential GND is applied. The $n^+$ type diffusion resistance region 8 and $n^+$ type diffusion region 33 are separated by a field oxide film 24.

In addition to the effects obtained by the seventh embodiment, in the present embodiment, the surge current leaked from $n^+$ type diffusion resistance region 8 to the silicon substrate 20 can be absorbed by the $n^+$ type diffusion region 33, since the $n^+$ type diffusion region 33 is provided around $n^+$ type diffusion resistance region 8. Therefore, the capability of absorbing surge current can be improved as compared with the seventh embodiment. Further, since the n type well region NW is provided below $n^+$ type refusion region 33, generation of a leak path between $n^+$ type diffusion region 33 and silicon substrate 20 can be prevented, as in the seventh embodiment.

Though $n^+$ type diffusion region 33 is provided entirely around $n^+$ type diffusion resistance region 8 in this embodiment, $n^+$ diffusion region 33 may be provided only at a portion around the $n^+$ type diffusion resistance region 8.

Figure 13:
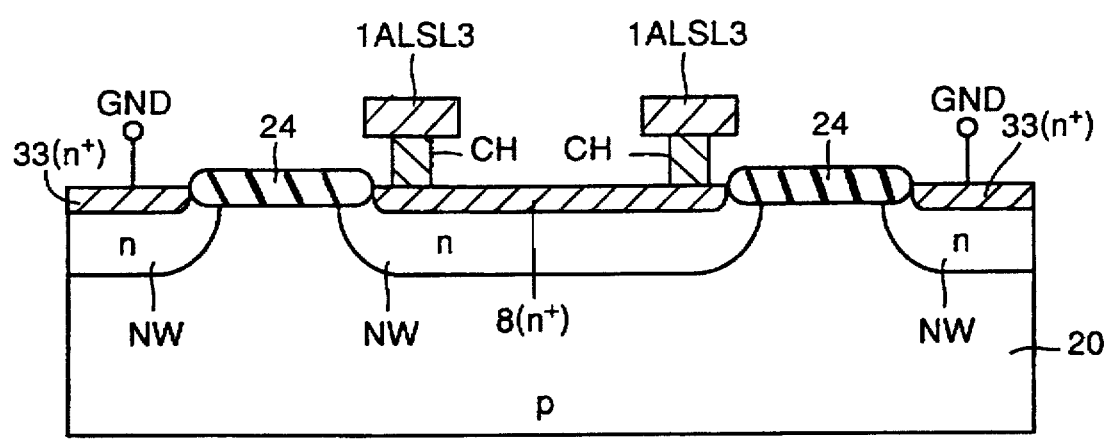
FIG. 13 is a cross section showing a modification of the DRAM shown in FIGS. 12A and 12B.

In this embodiment also, n type well region NW may be provided to cover entirely the lower side of $n^+$ type diffusion resistance region 8 as shown in FIG. 13.

Tenth Embodiment

FIG. 14A shows the pad 5.2 and portions therearound of the DRAM in accordance with the tenth embodiment of the present invention, and FIG. 14B is a cross section taken along the line B—B' of FIG. 14A.

Referring to FIGS. 14A and 14B, in the DRAM, below $n^+$ type source region 34s and $n^+$ type drain regions 34d of n type channel MOS transistor 34, which is the component of the internal circuitry of the DRAM, n type well region NW having lower impurity concentration than $n^+$ type source region 34 and $n^+$ type drain region 34d are provided.

More specifically, on the surface of silicon substrate 20, a gate electrode 34g is formed with a gate oxide film, not shown, interposed. On one side of gate electrode 34g, $n^+$ type source region 34s is formed, and on the other side of gate electrode 34g, an $n^+$ type drain region 34d is formed, thus an n channel MOS transistor 34 is obtained. The $n^+$ type drain region 34d is connected to signal line 1ALSL3 through a contact hole CH, and $n^+$ type source region 34s is connected to sinal line 1ALSL4 through a contact hole CH. The n channel MOS transistor 34 is separated from other regions by means of a field oxide film 24. The n type well regions NW are formed at portions where contact hole CH is in contact with n+ type source region 34s and $n^+$ type drain region 34d, respectively, in the silicon substrate 20 below the $n^+$ type source region 34s and $n^+$ type drain region 34d.

In this embodiment, since n type well regions NW are provided at junction portions between the contact hole CH and $n^+$ type source region 34s and the contact hole and $n^+$ type drain region 34d. Therefore, even when aluminum electrons in contact hole CH diffuse into $n^+$ type source region 34s and $n^+$ type drain region 34d, the influence of aluminum atoms on the junction portion between n type well region NW and silicon substrate 20 is small. Further, the gradient of impurity concentration below the junction portion between the contact hole CH and $n^+$ type source region 34s and $n^+$ type drain region 34d becomes smaller than in the prior art. Therefore, electric field below the contact hole CH becomes smaller when the surge current flows in, and hence smaller current flows from the contact hole CH to the silicon substrate 20. Therefore, damage at the junction portion between the $n^+$ type source region 34s and $n^+$ type drain region 34d below contact holes CH and silicon substrate 20 caused by the surge current can be prevented, and surge immunity is improved.

Eleventh Embodiment

Figure 15A:
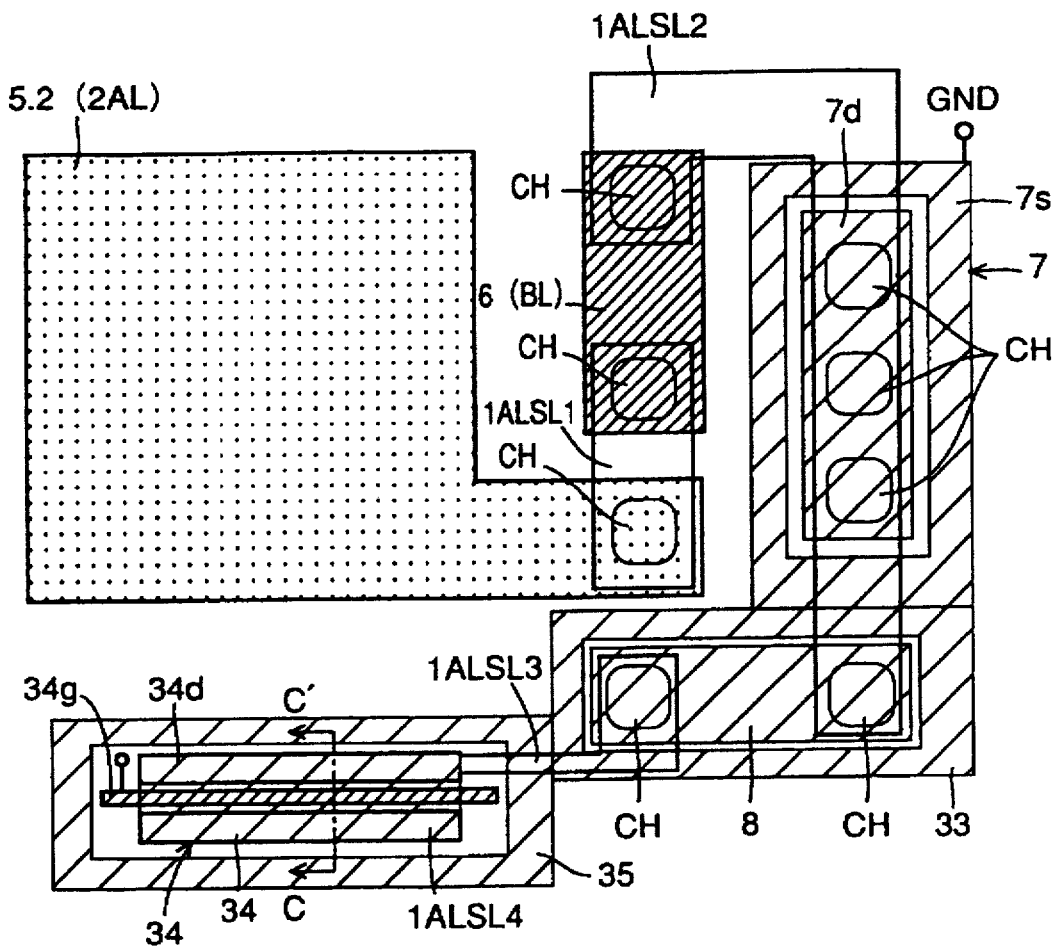
FIGS. 15A and 15B show the structure of pad 5.2 and portions therearound of the DRAM in accordance with an eleventh embodiment of the present invention.
Figure 15B:
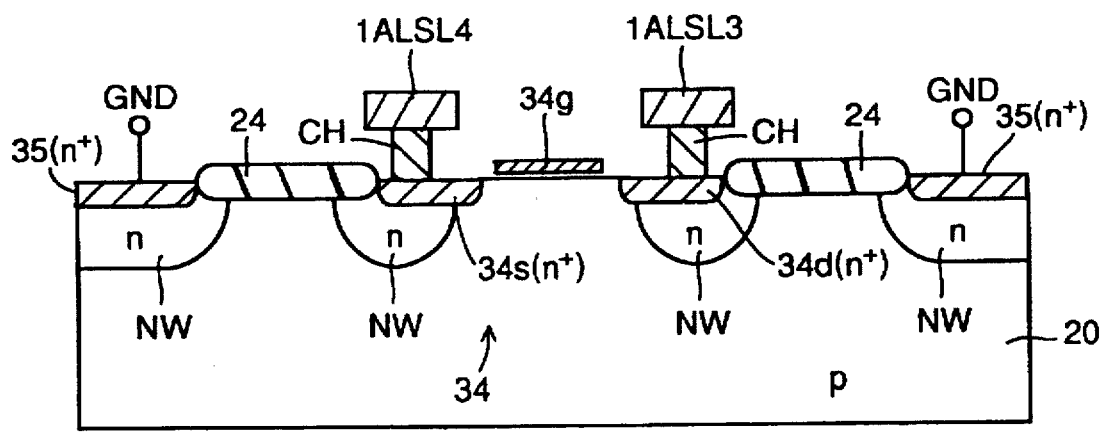

FIG. 15A shows the structure of the pad 5.2 and portions therearound of the DRAM in accordance with the eleventh embodiment of the present invention, and FIG. 15B is a cross section taken along the line C—C' of FIG. 15A.

Referring to FIGS. 15A and 15B, the DRAM differs from the DRAM shown in FIGS. 14A and 14B in that an n type well region NW is formed around the n channel MOS transistor 34 near the n channel MOS transistor 34 at the surface of silicon substrate 20 and that an $n^+$ type diffusion region 35 is formed at the surface of n type well region NW. To the $n^+$ type diffusion regions 35, as well as to the $n^+$ type source region 7s and of field transistor 7 and $n^+$ type diffusion region 33, the ground potential GND is applied. The n channel MOS transistor 34 and $n^+$ type diffusion region 35 are separated by field oxide film 24.

In addition to the effects obtained by the tenth embodiment, in the present embodiment, since the $n^+$ type diffusion region 35 is provided around n channel MOS transistor 34, the surge current leaking from n channel MOS transistor 34 to silicon substrate 20 can be absorbed by the $n^+$ type diffusion region 35. Therefore, the capability of absorbing surge current can be improved than the tenth embodiment. Further, since n type well region NW is provided below $n^+$ type diffusion region 35, generation of a leak path between $n^+$ type diffusion region 35 and silicon substrate 20 can be prevented, from the same reason as in the tenth embodiment.

Though $n^+$ type diffusion region 35 is provided entirely around n channel MOS transistor 34 in this embodiment, the $n^+$ diffusion region 35 may be provided only at a portion around n channel MOS transistor 34.

Twelfth Embodiment

Figure 16:
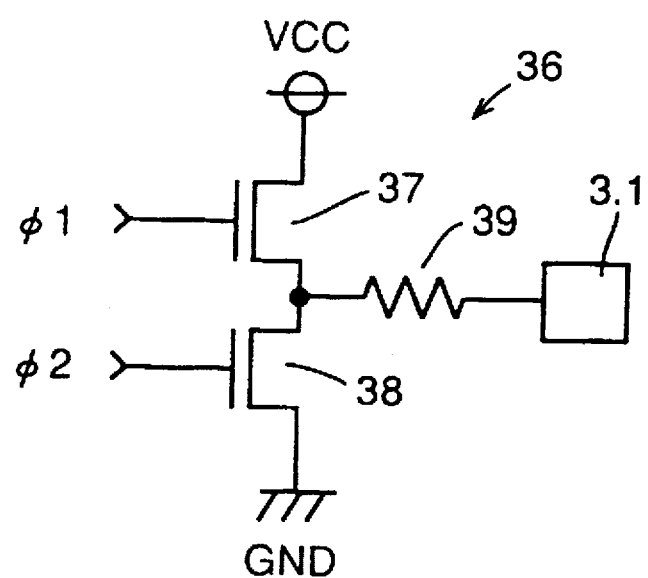
FIG. 16 is a schematic diagram showing a pad 3.1 and an output circuit 36 of the DRAM in accordance with a twelfth embodiment of the present invention.

FIG. 16 is a schematic diagram showing the structure of pad 3.1 for data signal input/output and the structure of an output circuit 36 connected thereto, of the DRAM in accordance with the twelfth embodiment of the present invention.

Referring to FIG. 16, output circuit 36 includes n channel MOS transistors 37 and 38 connected in series between a node of the power supply potential VCC (herein after referred to as the power supply node) and the ground node, and a resistance element 39 for limiting current connected between a connection node between n channel MOS transistors 37 and 38 and the pad 3.1. To the gate electrodes of n channel MOS transistors 37 and 38, internal data signals $\phi 1$ and $\phi 2$ from the internal circuitry are input, respectively.

When the signal $\phi 1$ is at logic high "H" level and signal $\phi 2$ is low "L" level, transistor 37 is rendered conductive, transistor 38 is rendered non-conductive and pad 3.1 attains to the "H" level. Conversely, when the signal $\phi 1$ is at the "L" level and the signal $\phi 2$ is at the "H" level, transistor 37 is rendered non-conductive, transistor 38 is rendered conductive, and pad 3.1 attains to the "L" level.

Output circuit 36 has such a function of amplifying internal data signals $\phi 1$ and $\phi 2$, and it also has the function of protecting the internal circuitry from the surge current flowing to the pad 3.1. Namely, the surge current flowing to the pad 3.1 is attenuated by resistance element 39 and flows out to the power supply node or to the ground node through transistor 37 or 38. Therefore, surge current can be prevented from flowing into the internal circuitry to cause damage therein.

However, even in such output circuit 36, the junction portion below the contact hole CH is susceptible to the influence of surge current. The present embodiment solves this problem.

Figure 17:
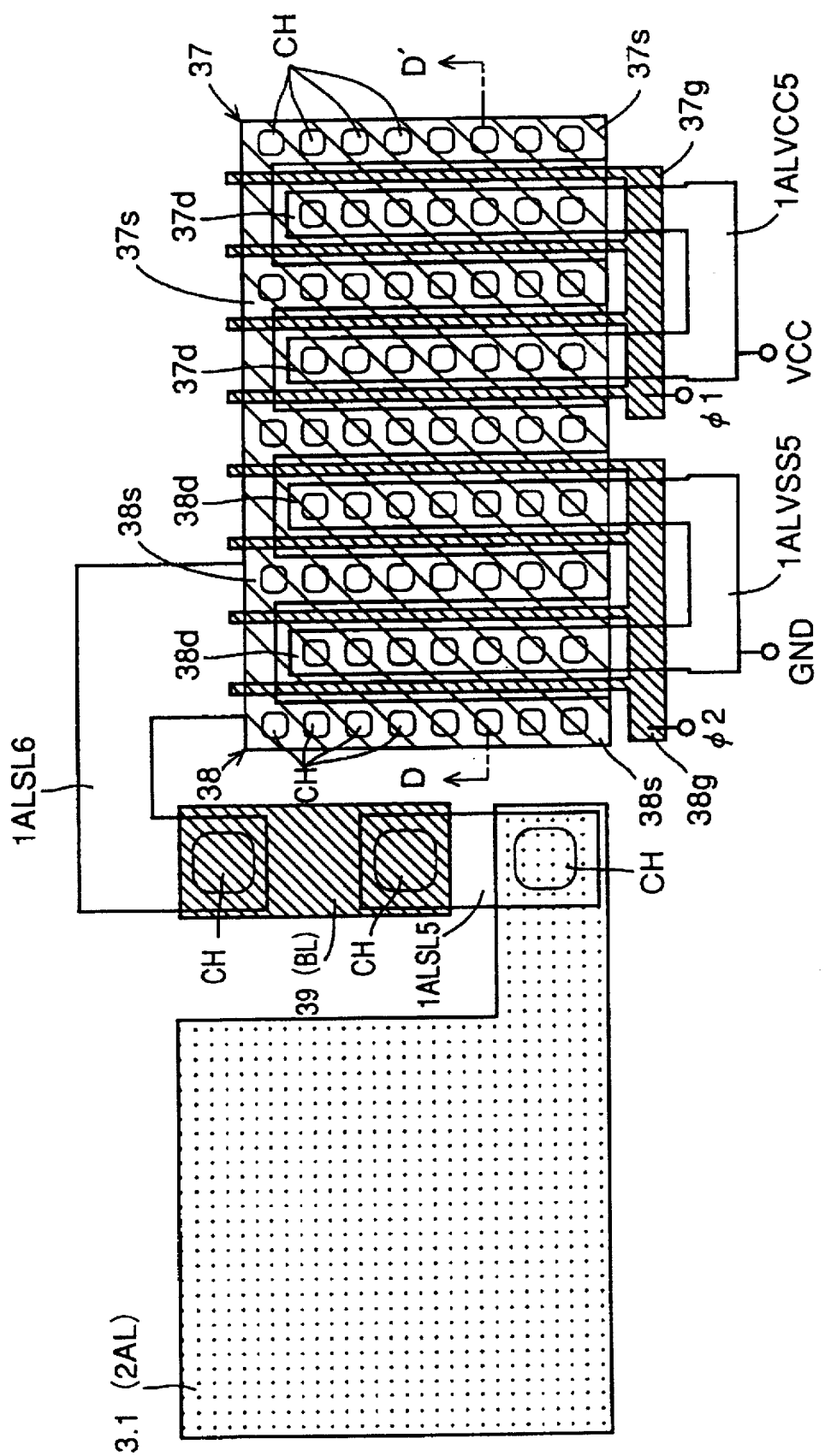
FIG. 17 shows a structure of the pad 3.1 and an output circuit 36 shown in FIG. 16.
Figure 18:
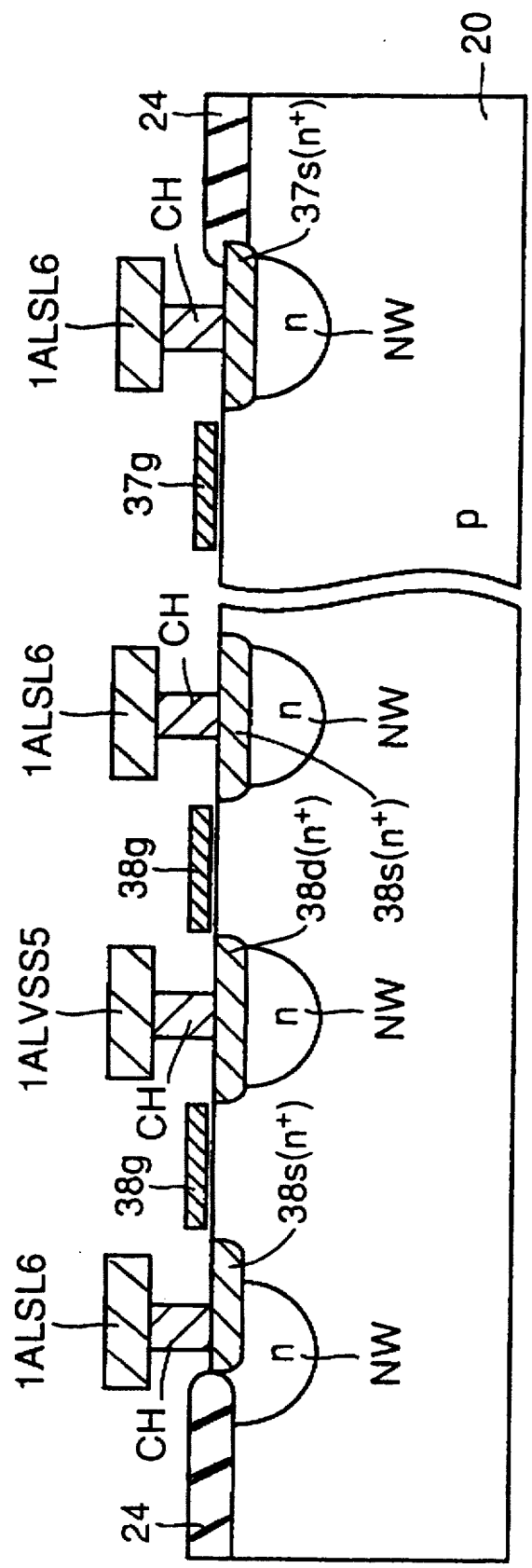
FIG. 18 is a cross section taken along the line D—D' of FIG. 17.

FIG. 17 shows the pad 3.1 and portions therearound, and FIG. 18 is a cross section taken along the line D—D' of FIG. 17.

Referring to FIGS. 17 and 18, in the DRAM, below the $n^+$ type source regions 37s and 38s and $n^+$ type drain regions 37d and 38d of n channel MOS transistors 37 and 38 constituting the output circuit 36, n type well regions NW having lower impurity concentration are formed.

More specifically, a plurality of gate electrodes 37g are formed on the surface of the silicon substrate 20, $n^+$ type source region 37s and $n^+$ type drain region 37d are formed alternately on both sides and between the gate electrodes 37g, and hence n channel MOS transistor 37 is formed. On the surface of silicon substrate 20, a plurality of gate electrodes 38g are formed, $n^+$ type source region 38s and $n^+$ type drain region 38d are formed alternatively on both sides and between the gate electrodes 38g, and hence n channel MOS transistor 38 is formed. Between each of the gate electrodes 37g and 38g and silicon substrate 20, a gate oxide film, not shown, is interposed. A plurality of gate electrodes 37g and 38g are provided in order to increase the gate width of n channel MOS transistors 37 and 38, so as to improve current drivability of n channel MOS transistors 37 and 38.

One end of gate electrode 37g is commonly connected to receive internal data signal $\phi 1$. One end of gate electrode 38g is commonly connected to receive internal data signal $\phi 2$. The $n^+$ type drain region 37d is connected to a column shaped power supply line 1ALVCC5 through a plurality of contact holes CH. To the power supply line 1ALVCC5, power supply potential VCC is applied. The $n^+$ type source region 38s is connected to a comb-shaped power supply line 1ALVSS5 through a plurality of contact holes CH. The ground potential GND is applied to the power supply line 1ALVSS5. The n$^+$ type source region 37s and n$^+$ type source region 38d are commonly connected to a comb-shaped signal line 1ALSL6 through a plurality of contact holes CH. The signal line 1ALSL6 is connected pad 3.1 through a resistance element 39 which is formed of a polycrystalline silicon layer BL.

The n type well regions NW are formed at portions corresponding to the contact portions between each of the contact holes CH and each of n$^+$ type source regions 37s and 38s and n$^+$ type drain regions 37d and 38d, in the silicon substrate 20 below n$^+$ type source region 37s and n$^+$ type drain regions 37d, 38d.

In this embodiment, since n type well regions NW are provided at portions below the contact portions between n$^+$ type source regions 37s, 38s, and n$^+$ type drain region 37d and 38d and each of the contact holes CH, even when aluminum atoms in contact hole CH diffuse in the n$^+$ type source regions 37s, 38s and n$^+$ type drain regions 37d and 38d, the aluminum atoms do not reach the junction portion between the n type well region NW and silicon substrate 20. Further, gradient of the impurity concentration below the junction portion between each of the contact holes CH and each of the n$^+$ type source regions 37s and 38s and n$^+$ type drain regions 37d and 38d becomes smaller than in the prior art. Therefore, electric field below the contact hole CH becomes smaller when the surge current flows, and smaller current flows from the contact hole CH to the silicon substrate 20. Therefore, damage to the junction portion between silicon substrate 20 and each of the n$^+$ type source regions 37s and 38s and n$^+$ type drain regions 37d and 38d below the contact holes CH caused by the surge current can be prevented, and hence surge immunity is increased.

Thirteenth Embodiment

Figure 19:
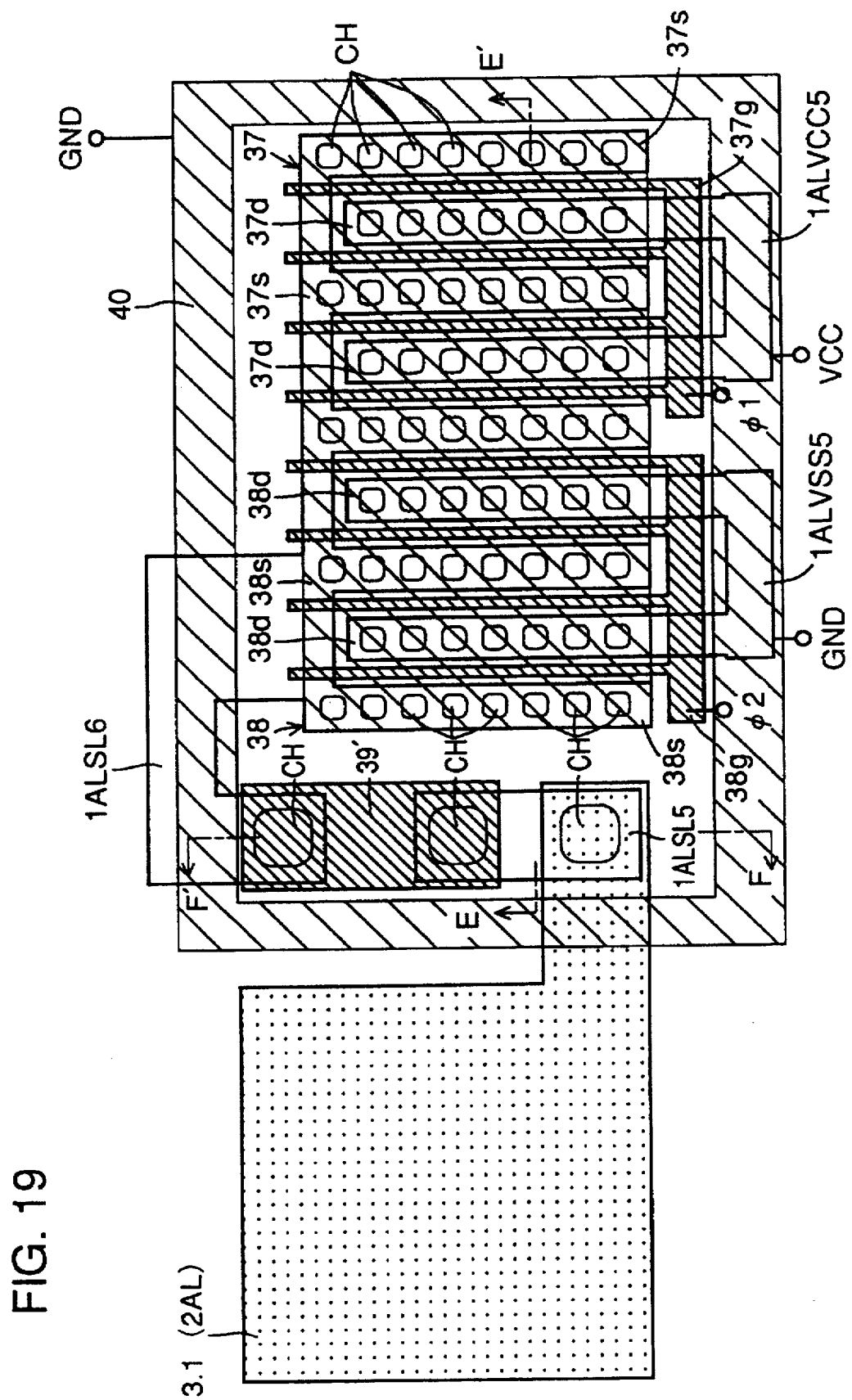
FIG. 19 shows a structure of the pad 3.1 and portions therearound of the DRAM in accordance with a thirteenth embodiment of the present invention.
Figure 20:
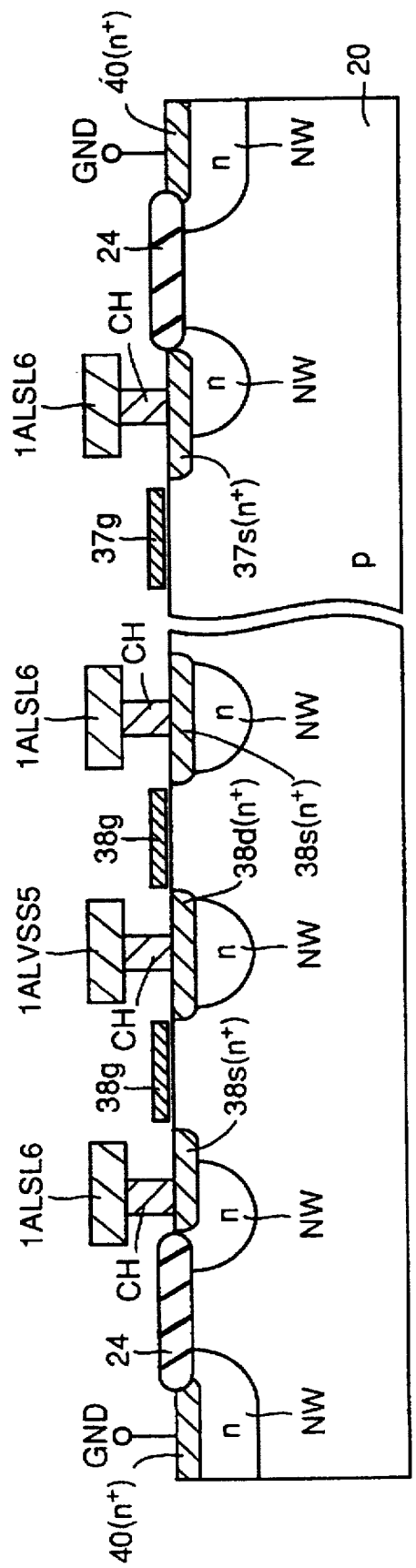
FIG. 20 is a cross section taken along the line E—E' of FIG. 19.
Figure 21:
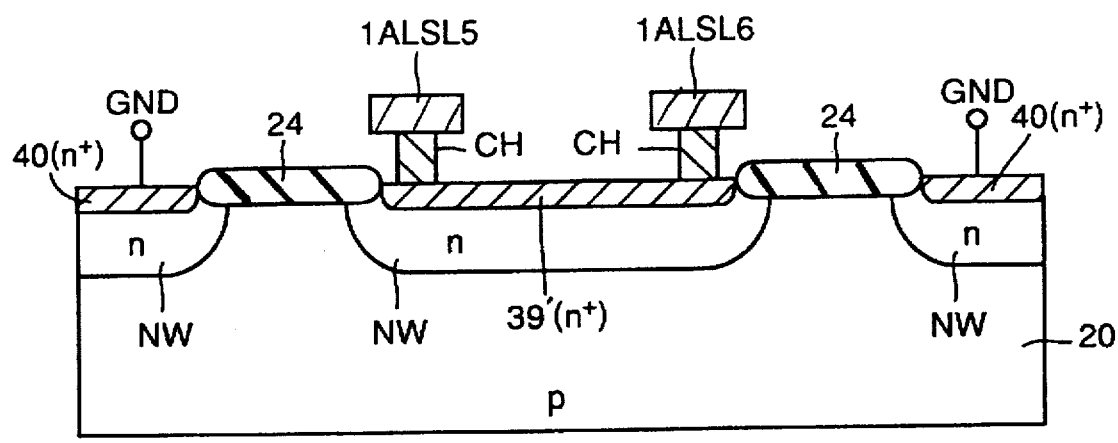
FIG. 21 is a cross section taken along the line F—F' of FIG. 19.

FIG. 19 shows the structure of the pad 3.1 and portions therearound of the DRAM in accordance with thirteenth embodiment of the present invention, FIG. 20 is a cross section taken along the line E—E' of FIG. 19, and FIG. 21 is a cross section taken along the line F—F' of FIG. 19.

Referring to FIGS. 19 to 21, the DRAM differs from the DRAM shown in FIGS. 16 to 18 in that resistance element 39 is replaced by an n$^+$ type diffusion resistance regions 39', that an n type well region NW is formed to surround n$^+$ type diffusion resistance region 39' and transistors 37 and 38, and that an n$^+$ type diffusion region 40 is formed at the surface of n type well region NW. Below the n$^+$ type diffusion resistance region 39', the n well region NW is formed. The ground potential GND is applied to the n$^+$ type diffusion region 40. Transistors 37 and 38, n$^+$ type diffusion resistance region 39' and n$^+$ type diffusion region 40 are separated from each other by field oxide film 24.

In this embodiment, in addition to the effects obtained by the twelfth embodiment, the surge current leaked from n$^+$ type diffusion resistance regions 39' and from n channel MOS transistor 37 and 38 to the silicon substrate 20 can be absorbed by the n$^+$ type diffusion region 40, since n$^+$ type diffusion region 40 is provided around n$^+$ type diffusion resistance 39' and n channel MOS transistors 37 and 38. Therefore, the capability of absorbing surge current is improved than the twelfth embodiment. Further, since n type well region NW is provided below n$^+$ type diffusion resistance region 39' and n$^+$ type diffusion region 40, the generation of a leak path between each of the n$^+$ type diffusion resistance region 39' and n$^+$ type diffusion region 40, and silicon substrate 20 can be prevented, from the same reason as in the twelfth embodiment.

Though n$^+$ type diffusion region 40 is provided entirely around n$^+$ type diffusion resistance region 39' and n channel MOS transistors 37 and 38 in this embodiment, the n$^+$ type diffusion region 40 may be provided only at a portion around n$^+$ type diffusion resistance region 39' and n channel MOS transistors 37 and 38.

Fourteenth Embodiment

Figure 22:
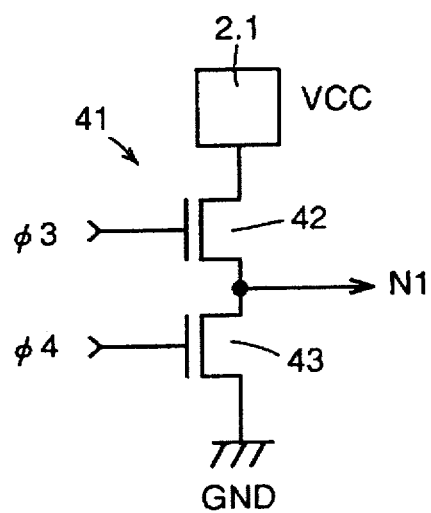
FIG. 22 is a schematic diagram showing the structure of the pad 2.1 and a switching circuit 41 of the DRAM in accordance with a fourteen embodiment of the present invention.

FIG. 22 is a schematic diagram showing a pad 2.1 for supplying power supply potential VCC and a switching circuit 41 connected thereto, of the DRAM in accordance with a fourteenth embodiment of the present invention.

Referring to FIG. 22, switching circuit 41 includes n channel MOS transistors 42 and 43 connected in series between the power supply node and the ground node. To the gate electrodes of n channel MOS transistors 42 and 43, control signals $\phi 3$ and $\phi 4$ from the internal circuitry are input, respectively. A connection node between n channel MOS transistors 42 and 43 is connected to a prescribed node N1 in the internal circuitry.

When the signal $\phi 3$ is at the "H" level and the signal $\phi 4$ at the "L" level, transistor 42 is rendered conductive, transistor 43 is rendered non-conductive, and node N1 attains to the power supply potential VCC. Conversely, when the signal $\phi 3$ is at the "L" level and signal $\phi 4$ is at the "H" level, transistor 42 is rendered non-conductive, transistor 43 is rendered conductive, and node N1 attains to the ground potential GND.

Switching circuit 41 thus has a function of switching the node N1 of the internal circuitry between the power supply potential VCC and the ground potential GND, and it also has the function of protecting the internal circuitry from the surge current flowing to the pad 2.1. Namely, the surge current which has flown to the pad 2.1 is flown out to the ground node through transistors 42 and 43. Therefore, damage to the internal circuitry by the surge current flowing therein can be prevented.

However, in the switching circuit 41, the junction portion below the contact hole CH is susceptible to the damage caused by the surge current. This embodiment solves this problem.

Figure 23:
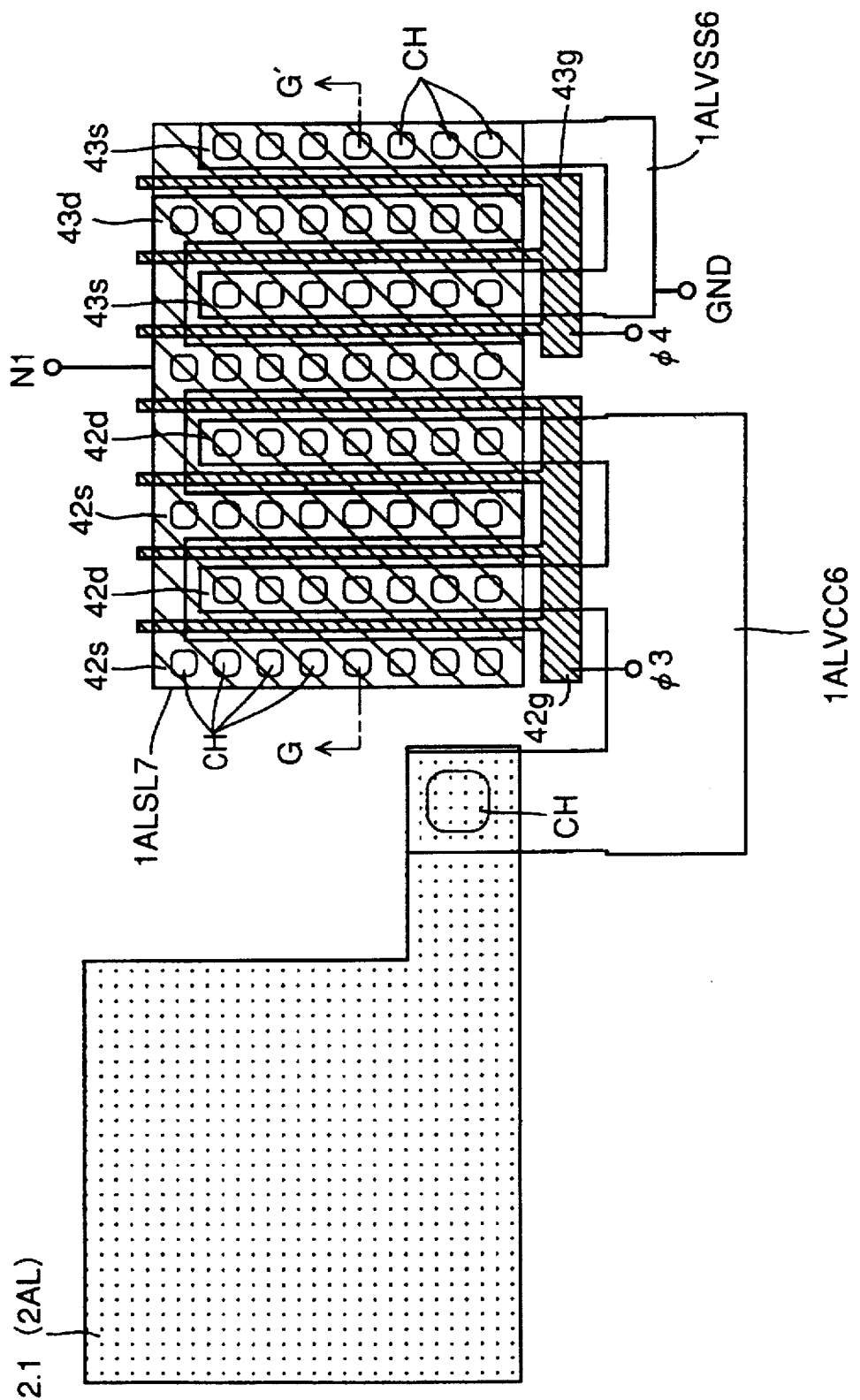
FIG. 23 shows a structure of the pad 2.1 and a switching circuit 41 of the DRAM shown In FIG. 22.
Figure 24:
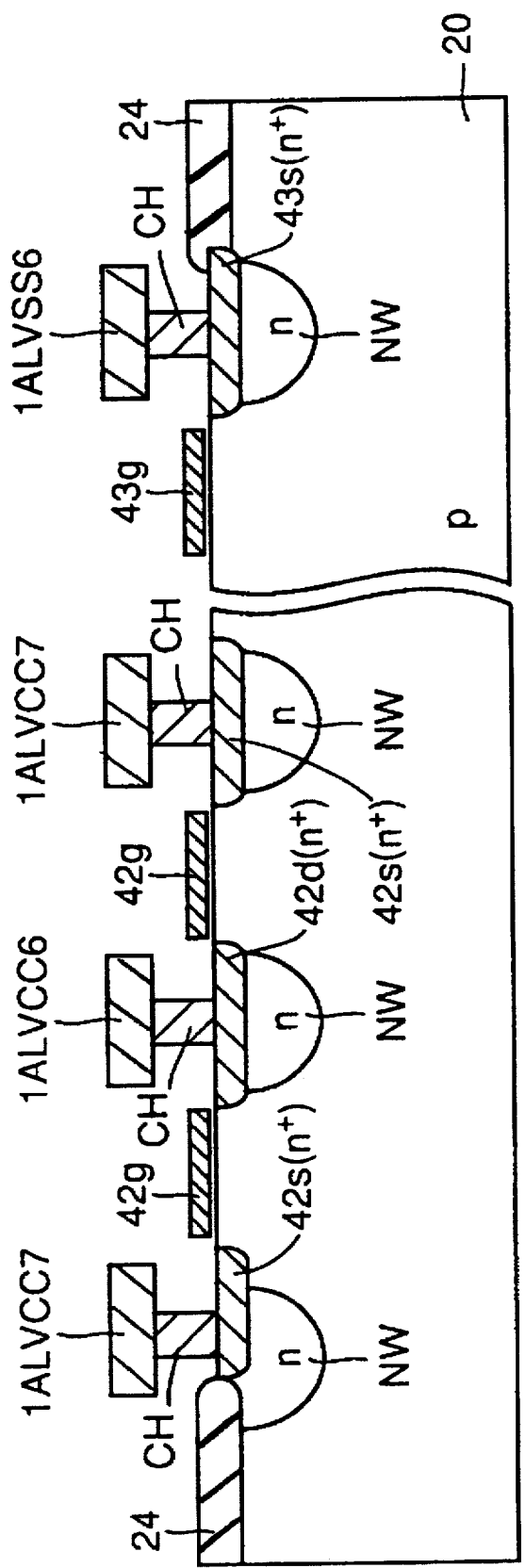
FIG. 24 is a cross section taken along line the line G—G' of FIG. 23.

FIG. 23 shows the structure of pad 2.1 and portions therearound, and FIG. 24 is a cross section along the line G—G' of FIG. 23.

Referring to FIGS. 23 and 24, in the DRAM, below n$^+$ type source regions 42s and 43s and n$^+$ type drain regions 42d and 43d of n channel MOS transistors 42 and 43 constituting switching circuit 41, n type well regions NW having lower impurity concentration are provided.

More specifically, on the surface of silicon substrate 20, a plurality of gate electrodes 42g are formed, n$^+$ type source regions 42s and n$^+$ type drain 42d are formed alternately on both sides and between the gate electrodes 42g, thus n channel MOS transistor 42 is formed. On the surface of silicon substrate 20, a plurality of gate electrodes 43g are formed, n$^+$ type source regions 43s and n$^+$ type drain regions 43d is formed alternately on both sides and between the gate electrodes 43g, and thus n channel MOS transistor 43 are formed. Between each of the gate electrodes 42g and 43g and silicon substrate 20, a gate oxide film, not shown, is provided. The plurality of gate electrodes 42g and 43g are provided so as to enlarge gate widths of n channel MOS transistor 42 and 43 in order to increase current drivability of n channel MOS transistors 42 and 43.

One end of gate electrode 42g is commonly connected to receive control signal $\phi 3$. One end of gate electrode 42g is commonly connected to receive control signal $\phi 4$. The n$^+$ type source region 43s connected to a comb-shaped power supply line 1ALVSS6 through a plurality of contact holes CH. To the power supply line 1ALVSS6, the ground potential VSS is applied. The n⁺ type source region 42s and n⁺ type drain region 43d are commonly connected to a comb-shaped signal line 1ALSL7 through a plurality of contact holes CH. The n⁺ type drain region 42d is connected to a comb-shaped power supply line 1ALVCC6 through a plurality of contact holes CH, and power supply line 1ALVCC is connected to a pad 2.1.

The n type well regions NW are formed at portions corresponding to the contact portions between each of the n⁺ type source regions 42s and 43s and n⁺ type drain regions 42d and 43d and each of the contact holes CH, in the silicon substrate 20 below the n⁺ type source regions 42s and 43s and n⁺ type drain regions 42d and 43d.

In this embodiment, since n type well regions NW are provided below the contact portions between each of the contact holes CH, and n⁺ type source regions 42s and 43s and n⁺ type drain regions 42d, 43d, even when aluminum atoms in contact hole CH diffuse into n⁺ type source regions 42s and 43s and n⁺ type drain regions 42d and 43d, the influence of the aluminum atoms on the junction portion between n type well regions NW and silicon substrate 20 is small. Further, gradient of impurity concentration below the contact portions between each of the contact holes CH and each of n⁺ type source regions 42s and 43s and n⁺ type drain regions 42d and 43d becomes smaller. Therefore, electric field below the contact holes CH becomes smaller when the surge current flows in, and smaller current flows from the contact hole CH to the silicon substrate 20. Therefore, damage at the junction portion between the silicon substrate 20 and each of n⁺ source regions 42s and 43s and n⁺ type drain regions 42d and 43d below the contact holes CH caused by the surge current can be prevented, and surge immunity is improved.

Fifteenth Embodiment

Figure 25:
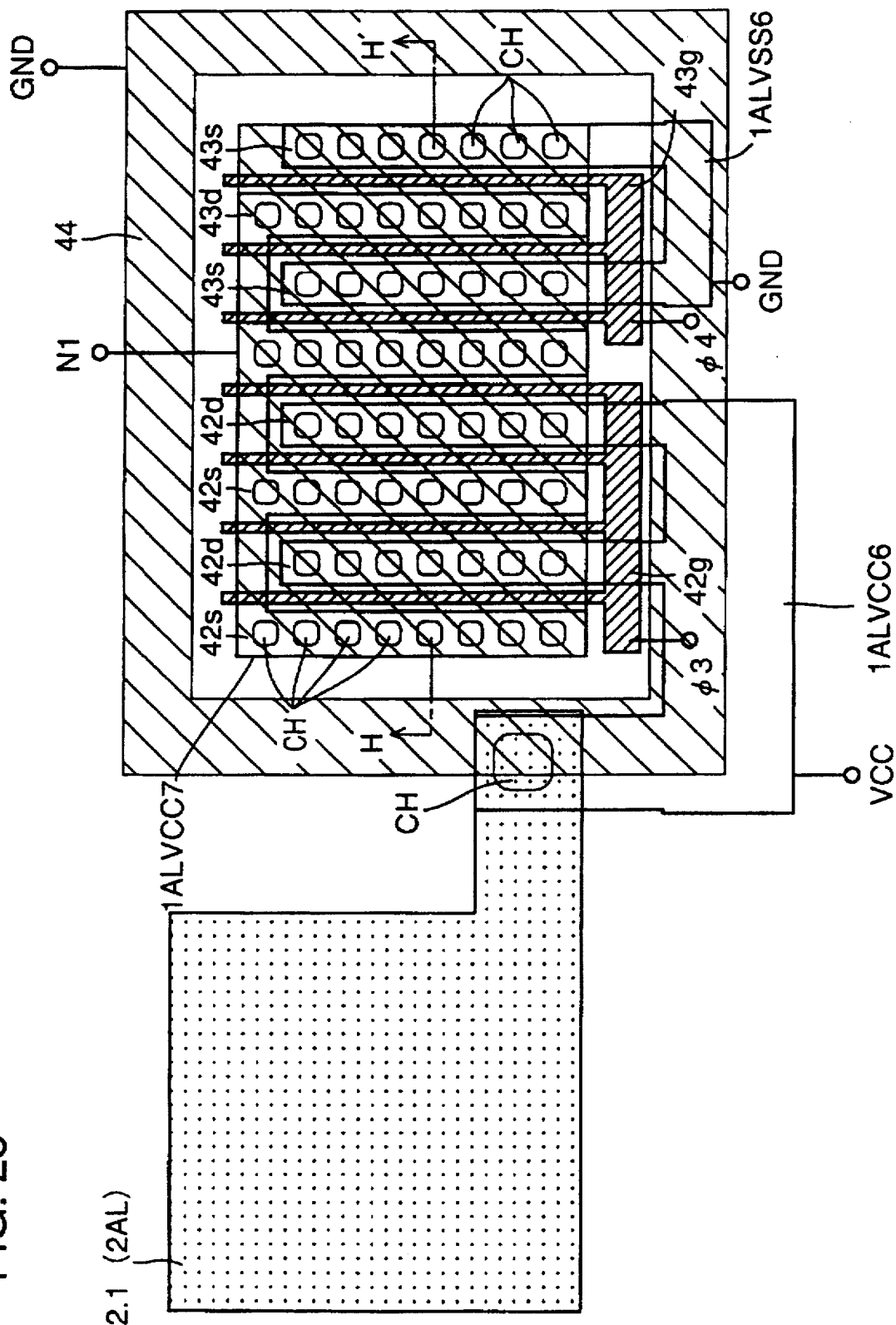
FIG. 25 shows a structure of pad 2.1 and portions therearound of the DRAM in accordance with a fifteenth embodiment of the present invention.
Figure 26:
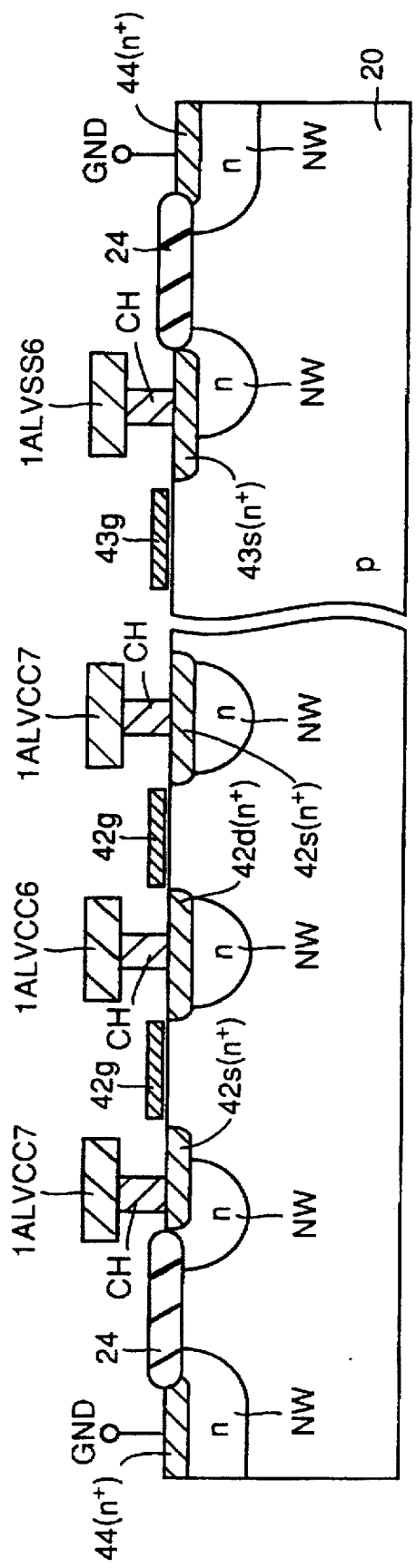
FIG. 26 is a cross section taken along line X—X' of FIG. 25.

FIG. 25 shows the structure of the pad 2.1 and portions therearound of the DRAM in accordance with the fifteenth of the present invention, and FIG. 26 is a cross section taken along line H—H' of FIG. 25.

Referring to FIGS. 25 and 26, the DRAM differs from that of FIGS. 22 to 24 in that an n type region NW formed surrounding transistors 42 and 43 is formed near the transistors 42 and 43 at the surface of silicon substrate 20, and that an n⁺ type diffusion region 44 is formed at the surface of n type well region NW. The ground potential GND is applied to the n⁺ type diffusion region 44. Transistors 42 and 43 and n⁺ type diffusion region 44 are separated by field oxide film 24.

In addition to the effect obtained by the fourteenth embodiment, in the present embodiment, the surge current leaked from transistors 42 and 43 to the silicon substrate 20 can be absorbed by the n⁺ type diffusion region 44, since n⁺ type diffusion region 44 is provided around transistors 42 and 43. Therefore, the capability of absorbing surge current is improved than in the fourteenth embodiment.

Further, since an n type well region NW is provided below n⁺ type diffusion region 44, generation of a leak path between n⁺ type diffusion region 44 and silicon substrate 20 can be prevented, from the same reason as in the fourteenth embodiment.

Though, n⁺ type diffusion region 44 is provided entirely around transistors 42 and 43, the n⁺ type diffusion region 44 may be provided only at the portion around transistors 42 and 43.

Sixteenth Embodiment

Figure 27A:
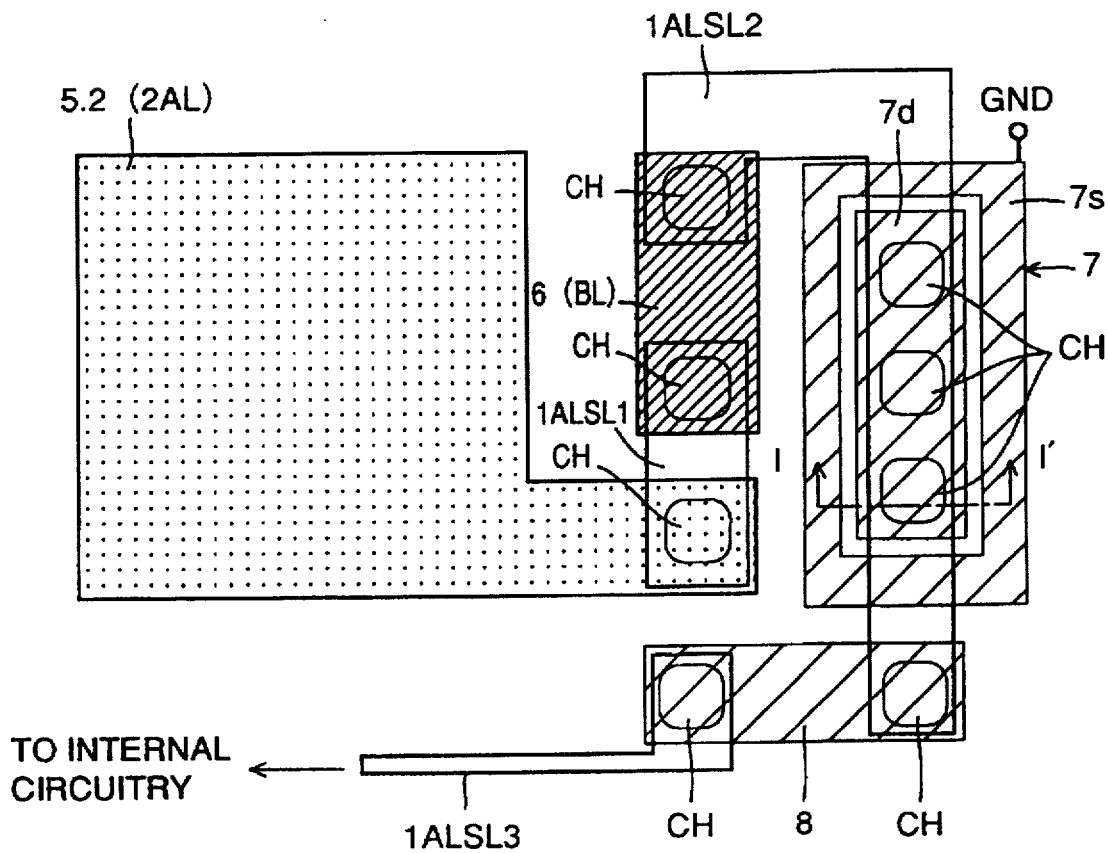
FIGS. 27A and 27B show the structure of the pad 5.2 and portions therearound of the DRAM in accordance with a sixteenth embodiment of the present invention.
Figure 27B:
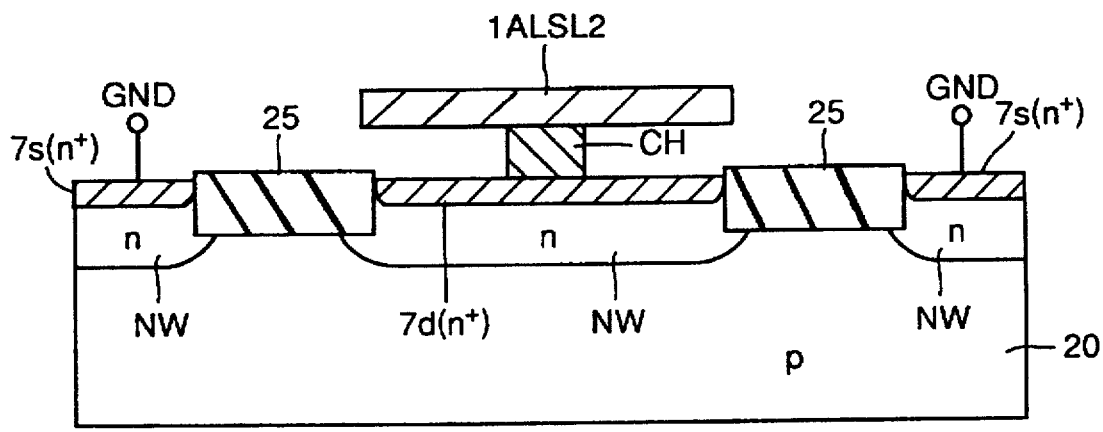

FIG. 27A shows the structure of pad 5.2 and portions therearound of the DRAM in accordance with the sixteenth embodiment of the present invention, and FIG. 27B is a cross section taken along the line I—I' of FIG. 27A.

Figure 39:
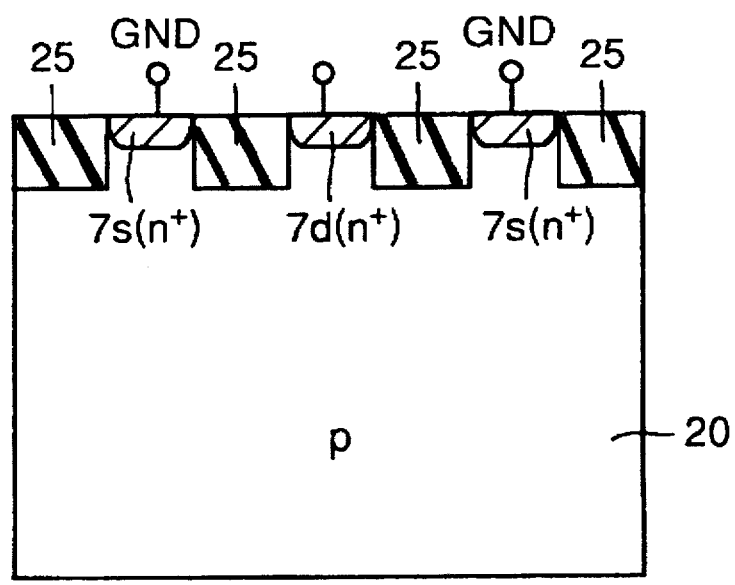
FIG. 39 is a cross section showing the structure of a still further conventional DRAM.

Referring to FIGS. 27A and 27B, the DRAM differs from the DRAM of FIG. 39 in that below each of the n⁺ type source region 7s and n⁺ type drain region 7d of field transistor 7, an n type well region NW having lower impurity concentration than the n⁺ type source region 7s and n⁺ type drain region 7d is formed.

In this embodiment, since the n type well region NW is provided below n⁺ type source 7s and n⁺ type drain region 7d, damage to the junction portion below the contact hole CH can be prevented from the same reason as in the seventh embodiment, for example, and surge immunity can be improved.

Further, the n type well region NW below the n⁺ type drain region 7d, p type silicon substrate 20, and n type well region NW below the n⁺ type source region 7s provide a npn bipolar transistor. Since the base current of the npn bipolar transistor is not intercepted by the trench separation region 25 as in the prior art, surge absorbing capability can be improved as compared with the prior art.

Though n⁺ type diffusion region is separated by field oxide film 24 in the seventh to fifteenth embodiments, the same effect can be obtained even when n⁺ type diffusion region is separated by the trench separation region 25.

Seventeenth Embodiment

Figure 28A:
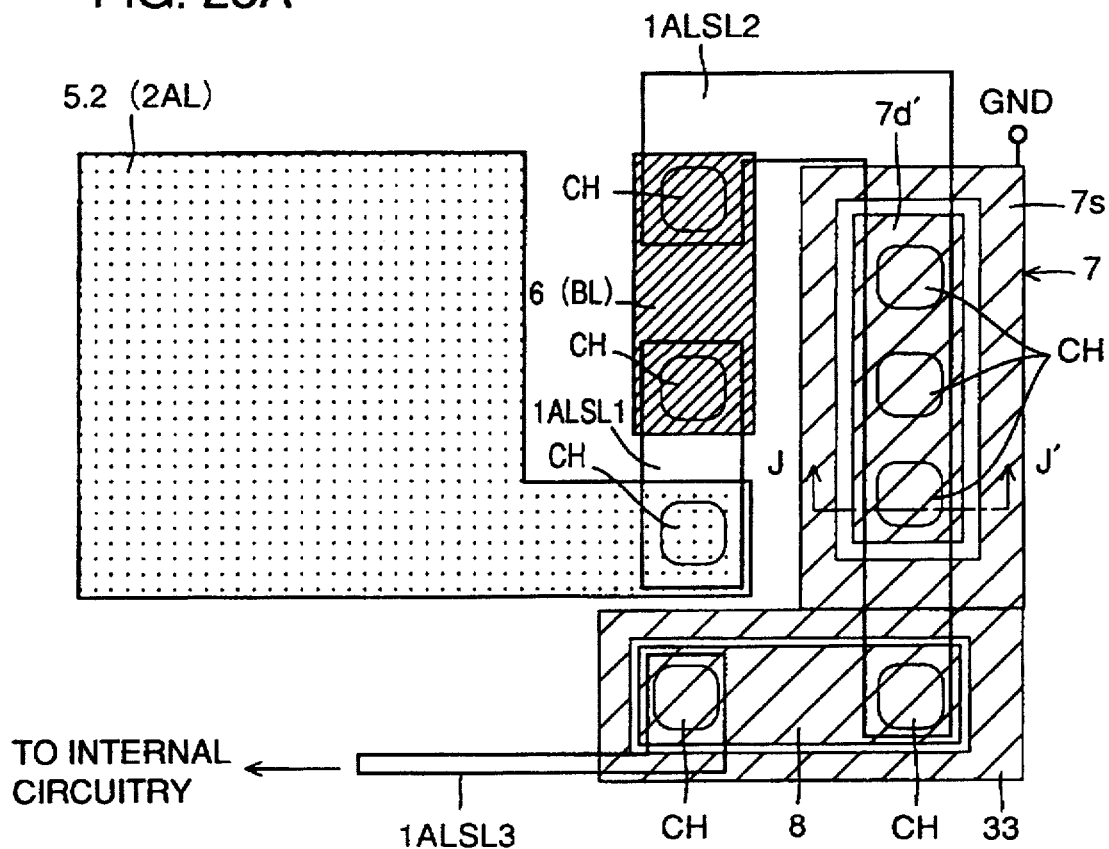
FIGS. 28A and 28B show a structure of the pad 5.2 and portions therearound of the DRAM in accordance with the seventeenth embodiment of the present invention.
Figure 28B:
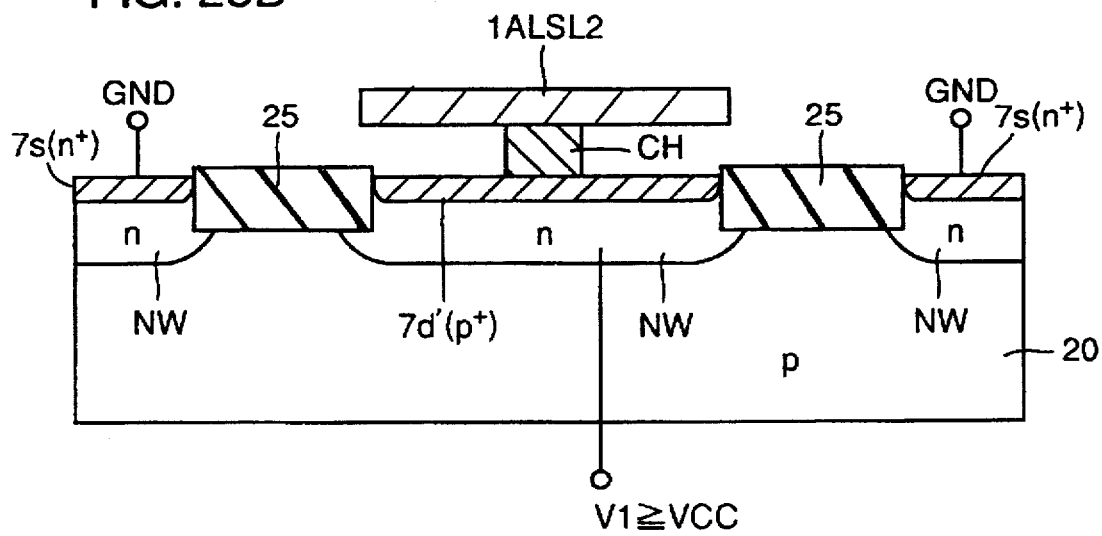

FIG. 28A shows the structure of pad 5.2 and portions therearound of the DRAM in accordance with the seventeenth embodiment of the present invention, and FIG. 28B is a cross section taken along the line J—J' of FIG. 28A.

Referring to FIGS. 28A and 28B, the DRAM differs from the DRAM of FIGS. 27A and 27B in that n⁺ type drain region 7d of field transistor 7 is replaced by a p⁺ type drain region 7d', and a bias potential V1 higher than the power supply potential VCC is applied to the n type well region NW below the p⁺ type region 7d'. The bias potential V1 (V1≧VCC) is applied to the n type well region NW below p⁺ type drain region 7d' in order to prevent current from flowing into the n type well region NW from pad 5.2, when a binary signal including the potential not higher than the power supply potential VCC, for example, the power supply potential VCC and the ground potential GND is input to the pad 5.2. Generally, the input signal level VIL may exceed the power supply potential VCC. However, in that case, what is necessary is to apply a bias potential V1 which satisfies V1≧(maximum value of Vin) to the n type well region NW below p⁺ type drain region 7d'.

In this embodiment, the n⁺ type drain region 7d is replaced by the p⁺ type drain region 7d', and therefore, p⁺ type drain region 7d', n well region NW therebelow and p type silicon substrate 20 provide a vertical pnp bipolar transistor. Therefore, the surge current flows horizontally through the npn bipolar transistor shown in the sixteenth embodiment, and in addition, it flows vertically through the pnp bipolar transistor. Therefore, the surge absorbing capability can further be increased from the sixteenth embodiment.

Figure 29:
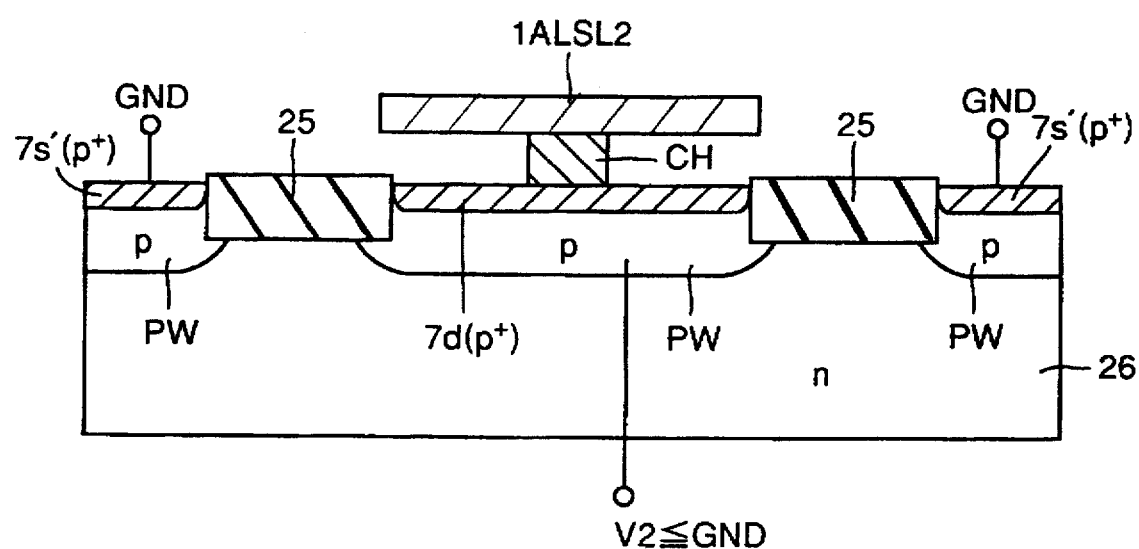
FIG. 29 is a cross section showing a modification of the DRAM shown in FIG. 28.
Figure 30:
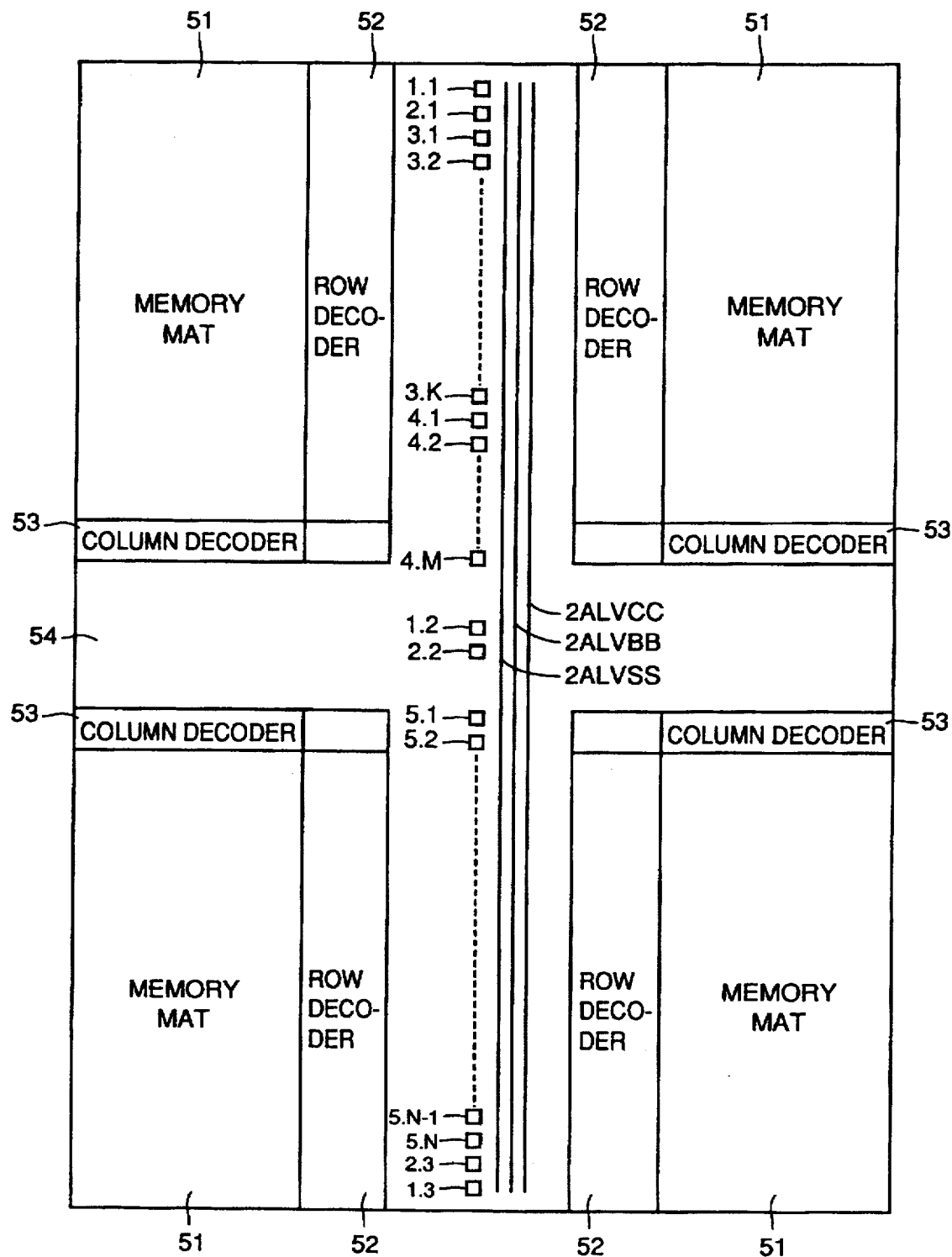
FIG. 30 shows a chip layout of a conventional DRAM.
Figure 31:
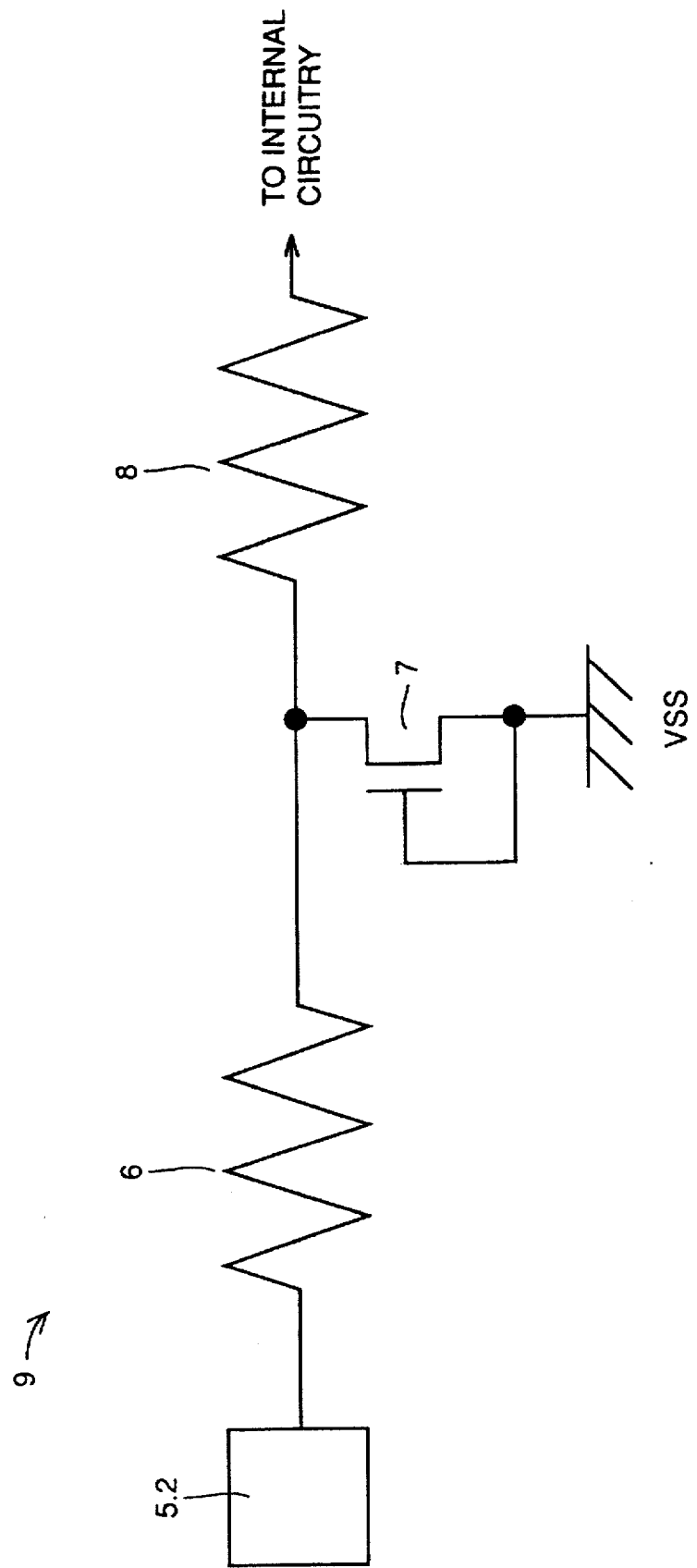
FIG. 31 is a schematic diagram showing the structure of internal protecting circuitry provided corresponding to each pad of the DRAM shown in FIG. 30.

The same effect can be obtained when the conductivity type is switched between p type and n type in the DRAM of FIG. 28, as shown in FIG. 29. However, in that case, a bias potential V2 which is not higher than the ground potential GND must be applied to the p type well region PW below the n⁺ type drain region 7d.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate to which at least a plurality of control clock signals and a plurality of address signals are externally applied, comprising:

a plurality of input terminals provided respectively for said plurality of control clock signals and said plurality of address signals;

a first upper power supply line provided common to said plurality of input terminals, to which a first power supply potential is applied;

a second upper power supply line provided common to said plurality of input terminals, to which a second power supply potential is applied;

a lower power supply line provided corresponding to each input terminal;

a first well region of a first conductivity type provided at the surface of said semiconductor substrate corresponding to each input terminal, having a potential fixed region connected to said first upper power supply line only through a corresponding lower power supply line;

second and third well regions of a second conductivity type formed on a surface of each said first well region and each having a potential fixed region connected to said second upper power supply line; and internal protecting means provided corresponding to each input terminal and including a field transistor of the first conductivity type formed at a surface of the corresponding second well region and a diffused resistance element of the first conductivity type formed at a surface of the corresponding third well region, for protecting inner portion from a surge current flowing to the corresponding input terminal.

2. The semiconductor memory device according to claim 1, wherein
said second and third well regions are formed continuously.

3. The semiconductor memory device according to claim 1, wherein
of the plurality of first well regions corresponding to said plurality of input terminals, at least two adjacent ones are formed continuously.

4. A semiconductor memory device formed on a semiconductor substrate to which at least a plurality of control clock signals and a plurality of address signals are externally applied, comprising:

a plurality of input terminals provided corresponding to said plurality of control block signals and said plurality of address signals, respectively;

a first power supply line provided common to said plurality of input terminals, to which a first power supply potential is applied;

a second power supply line provided common to said plurality of input terminals, to which a second power supply potential is applied;

a first well region of a first conductivity type formed at a surface of said semiconductor substrate corresponding to each of the input terminals, having a potential fixed region connected to said first power supply line;

second and third well regions formed at a surface of each of the first well regions and each having a potential fixed region connected to said second power supply line; and internal protecting means provided corresponding to each of the input terminals including a field transistor of the first conductivity type formed at a surface of the corresponding one of the second well regions and a diffused resistance element of the first conductivity type formed at a surface of the corresponding one of the third well regions and having distance between an input side end and the potential fixed region of said first well region set to be not smaller than a prescribed value, for protecting inner portion from a surge current flowing to the corresponding input terminal.

5. The semiconductor memory device according to claim 4, wherein
said second and third well regions are formed continuously.

6. The semiconductor memory device according to claim 4, wherein
of the plurality of first well regions corresponding to said plurality of input terminals, at least two adjacent ones are formed continuously.

7. A semiconductor memory device formed on a semiconductor substrate, to which at least a plurality of control block signals and a plurality of address signals are applied externally, comprising:

a plurality of input terminals provided corresponding to said plurality of control block signals and said plurality of address signals, respectively;

a first power supply line provided common to said plurality of input terminals, to which a first power supply potential is applied;

a second power supply line provided common to said plurality of input terminals, to which a second power supply potential is applied;

a first well region of a first conductivity type formed at a surface of said semiconductor substrate corresponding to each of said input terminals, having a potential fixed region formed to have a columnar shape from the surface to an inner portion, said potential fixed region being connected to said first power supply line;

second and third well regions formed at a surface of said first well region corresponding to each of the input terminals, each having a potential fixed region connected to said second power supply line; and internal protecting means provided corresponding to each of the input terminals, including a field transistor of the first conductivity type formed at a surface of the corresponding one of the second well regions and a diffused resistance element of the first conductivity type formed at a surface of the corresponding one of the third well regions, for protecting an inner portion from a surge current flowing to the corresponding input terminal.

8. The semiconductor memory device according to claim 7, wherein
said second and third well regions are formed continuously.

9. The semiconductor memory device according to claim 7, wherein
of the plurality of first well regions corresponding to said plurality of input terminals, at least two adjacent ones are formed continuously.

10. The semiconductor memory device formed on a semiconductor substrate, to which at least a plurality of control clock signals and a plurality of address signals are applied externally, comprising:

a plurality of input terminals provided corresponding to said plurality of control clock signals and said plurality of address signals, respectively;

a first power supply line provided common to said plurality of input terminals, to which a first power supply potential is applied;

a second power supply line provided common to said plurality of input terminals, to which a second power supply potential is applied;

a resistance element provided corresponding to each of the input terminals;

a first well region of a first conductivity type formed at a surface of said semiconductor substrate corresponding to each of the input terminals, and having a potential fixed region connected said first power supply line through the corresponding one of the resistance elements;

second and third well regions of a second conductivity type formed at a surface of said first well region corresponding to each of the input terminals, each having a potential fixed region connected to said second power supply line; and internal protecting means provided corresponding to each of the input terminals and including a field transistor of the first conductivity type formed at a surface of the corresponding one of the second well regions and a diffused resistance element of the first conductivity type formed at a surface of the corresponding one of the third well regions, for protecting an inner portion from a surge current flowing to the corresponding input terminal.

11. The semiconductor memory device according to claim 10, wherein said second and third well regions are formed continuously.

12. The semiconductor memory device according to claim 10, wherein of the plurality of first well regions corresponding to said plurality of input terminals, at least two adjacent ones are formed continuously.

13. A semiconductor memory device formed on a semiconductor substrate, to which at least a plurality of control clock signals and a plurality of address signals are applied externally, comprising:

a plurality of input terminals provided corresponding to said plurality of control clock signals and said plurality of address signals, respectively;

a first power supply line provided common to said plurality of input terminals, to which a first power supply potential is applied;

a second power supply line provided common to said plurality of input terminals, to which a second power supply potential is applied;

a first well region of a first conductivity type formed at a surface of said semiconductor substrate corresponding to each of the input terminals, and having a potential fixed region connected to said first power supply line; and a second well region of a second conductivity type formed at a surface of each of the first well regions, and having a potential fixed region connected to said second power supply line; and internal protecting means provided corresponding to each of the input terminals and including a field transistor of the first conductivity type formed at a surface of the corresponding one of the second well regions and a diffused resistance element of the first conductivity type, for protecting an inner portion from a surge current flowing to the corresponding input terminal.

14. The semiconductor memory device according to claim 13, wherein of the plurality of first well region corresponding to said plurality of input terminals, at least two adjacent ones are formed continuously.

15. A semiconductor memory device formed on a semiconductor substrate, to which at least a plurality of control clock signals and a plurality of address signals are applied externally, comprising:

a plurality of input terminals provided corresponding to said plurality of control clock signals and said plurality of address signals, respectively, and divided into one or more groups;

a first upper power supply line provided common to said plurality of input terminals, to which a first power supply potential is applied;

a second upper power supply line provided common to said plurality of input terminals, to which a second power supply potential is applied;

a lower power supply line provided corresponding to each group of the input terminals;

a first well region of a first conductivity type formed at a surface of said semiconductor substrate corresponding to each group of the input terminals, and having a potential fixed region connected to said first upper power supply line only through a corresponding one of the lower power supply lines;

second and third well regions provided at a surface of the corresponding one of the first well regions corresponding to each input terminal, each having a potential fixed region connected to the second upper power supply line; and internal protecting means provided corresponding to each of the input terminals, and including a field transistor of the first conductivity type formed at a surface of the corresponding one of the second well regions and a diffused resistance element of the first conductivity type formed at a surface of the corresponding one of the third well regions, for protecting an inner portion from a surge current flowing into the corresponding input terminal.

16. The semiconductor memory device according to claim 15, wherein said second and third well regions are formed continuously.

17. A semiconductor memory device formed on a semiconductor substrate, to which at least a plurality of control clock signals and a plurality of address signals are applied externally, comprising:

a plurality of input terminals provided corresponding to said plurality of control clock signals and said plurality of address signals respectively, and divided into one or more groups;

a first power supply line provided common to said plurality of input terminals, to which a first power supply potential is applied;

a second power supply line provided common to said plurality of input terminals, to which a second power supply potential is applied;

a first well region of a first conductivity type formed at a surface of said semiconductor substrate corresponding to each group of the input terminals, having a potential fixed region connected to said first power supply line;

second and third well regions of a second conductivity type formed at a surface of the corresponding one of the first well regions corresponding to each input terminal, each having a potential fixed region connected to said second power supply line; and internal protecting means provided corresponding to each input terminal and including a field transistor of the first conductivity type formed at a surface of the corresponding one of the second well regions and a diffused resistance element of the first conductivity type formed at a surface of the corresponding one of the third well regions, for protecting an inner portion from a surge current flowing to the corresponding input terminal.

18. The semiconductor memory device according to claim 17, wherein said second and third well regions are formed continuously.

19. The semiconductor memory device according to claim 17, wherein distance between an input side end of the diffusion resistance element of said internal protecting means and the potential fixed region of said first well region is set to be not smaller than a prescribed value.

20. The semiconductor memory device according to claim 19, wherein said second and third well regions are formed continuously.

21. A semiconductor memory device according to claim 17, wherein the potential fixed region of said first well region is formed to have a columnar shape from a surface of the first well region to an inner portion.

22. The semiconductor memory device according to claim 21, wherein said second and third well regions are formed continuously.

23. The semiconductor memory device according to claim 17, further comprising;

a resistance element provided corresponding to each group of the input terminals, wherein the potential fixed region of said first well region is connected to said first power supply line through the corresponding resistance element.

24. The semiconductor memory device according to claim 23, wherein said second and third well regions are formed continuously.

25. A semiconductor memory device formed on a semiconductor substrate, comprising:

an input terminal to which a signal is input externally;

an internal circuitry performing a prescribed operation in response to the signal input to said input terminal;

internal protecting means including a diffused resistance element formed at a surface of said semiconductor substrate and connected to said input terminal and to said internal circuitry by means of a metal interconnection, for protecting said internal circuitry from a surge current flowing to said input terminal; and an impurity diffused well region formed in the surface of the substrate and having lower impurity concentration than said diffused resistance element, said impurity diffused well region being formed at least at a position corresponding to a contact portion between said diffused resistance element and said metal interconnection, in a portion of the semiconductor substrate below said diffused resistance element of said internal protecting means.

26. A semiconductor device formed on a semiconductor substrate, comprising:

an input terminal to which a signal is input externally;

an internal circuitry performing a prescribed operation in response to the signal input to said input terminal;

internal protecting means formed at a surface of said semiconductor substrate and including a first impurity diffused resistance region connected to said input terminal and to said internal circuitry by a metal interconnection, for protecting said internal circuitry from a surge current flowing to said input terminal; and a second impurity resistance region formed separated from said first impurity diffused resistance region of said internal protecting means, to which a fixed potential is applied.

27. The semiconductor device according to claim 26, further comprising;

a first impurity diffused well region formed in the surface of the substrate and having lower impurity concentration than the first impurity diffused resistance region, said first impurity diffused well region being formed at least at a position corresponding to a contact portion between the first impurity diffused resistance region and said metal interconnection, in a portion of the semiconductor substrate below said first impurity diffused resistance region of said internal protecting means.

28. The semiconductor device according to claim 27, further comprising:

a second impurity diffused well region formed in the surface of the substrate separated from said first impurity diffused resistance region of said internal protecting means;

wherein said second impurity diffused resistance region is formed at a surface of said second impurity diffused well region and has higher impurity concentration than said second impurity diffused well region.

29. The semiconductor device according to claim 26, wherein said first impurity diffused resistance region of said internal protecting means constitutes a diffused resistance element.

30. A semiconductor memory device formed on a semiconductor substrate, comprising:

an input terminal to which a signal is input externally;

an internal circuitry performing a prescribed operation in response to the signal input to said input terminal;

an internal protecting means including a first impurity diffused resistance region formed at a surface of said semiconductor substrate, for protecting said internal circuitry from a surge current input to said input terminal; and a second impurity diffused region formed at a surface of said first impurity diffused resistance region of said internal protecting means having higher impurity concentration than said first impurity diffused resistance region and connected to said input terminal and said internal protecting means by a metal interconnection.

31. The semiconductor device according to claim 30, wherein said first impurity diffused resistance region of said internal protecting means constitutes a diffused resistance element.

32. A semiconductor device formed on a semiconductor substrate, comprising:

an input terminal to which a signal is input externally;

an internal protecting means for protecting an inner portion from a surge current flowing to said input terminal;

an internal circuitry including a first impurity diffused region formed at a surface of the semiconductor substrate and connected to said input terminal by a metal interconnection, responsive to a signal input to said input terminal for performing a prescribed operation; and a second impurity diffused region formed in the semiconductor substrate and having higher impurity concentration than said first impurity diffused region, formed at least at a portion corresponding to a contact portion between said first impurity diffused region and said metal interconnection in a portion of the semiconductor substrate below said first impurity diffused region of said internal circuitry.

33. A semiconductor device formed on a semiconductor substrate, comprising:

an input terminal to which a signal is input externally;

internal protecting means for protecting an inner portion from a surge current input to said input terminal;

an internal circuitry including a first impurity diffused region formed at a surface of the substrate and connected to said input terminal by a metal interconnection responsive to a signal input to said input terminal for performing a prescribed operation; and a second impurity diffused region formed at the surface of the substrate separated from said first impurity diffused region of said internal circuitry, to which a fixed potential is applied.

34. The semiconductor device according to claim 33, further comprising:

a first impurity diffused well region formed in the substrate and having lower impurity concentration than the first impurity diffused region, formed at least at a portion corresponding to a contact portion between said first impurity diffused region and said metal interconnection in a portion of a semiconductor substrate below said first impurity diffused region of said internal circuitry.

35. The semiconductor device according to claim 34, further comprising:

a second impurity diffused well region formed in the substrate; wherein said second impurity diffused region is formed at a surface of said second impurity diffused well region and has higher impurity concentration than said second impurity diffused well region.

36. A semiconductor device formed on a semiconductor substrate, comprising:

an input terminal to which a signal is externally input;

an internal circuitry performing a prescribed operation in response to a signal input to said input terminal; and internal protecting means including a first well region formed in the substrate and having a conductivity type different from that of said semiconductor substrate, a first impurity diffused region of the same conductivity type as said semiconductor substrate formed at a surface of said well region and connected to said input terminal and to said internal circuitry, a second well region formed in the semiconductor substrate and having a conductivity type different from that of said semiconductor substrate, and a second impurity diffused region having the same conductivity type as said semiconductor substrate, formed at a surface of said second well region, to which a fixed potential is applied, for protecting said internal circuitry from a surge current input to said input terminal.

37. The semiconductor device according to claim 36, wherein a bias potential for preventing flow of current from said input terminal to said first well region in a normal operation is applied to said first well region.

38. The semiconductor device according to claim 36, wherein said semiconductor device is formed on said semiconductor substrate having a trench separation structure.

* * * * *